United States Patent
Noh et al.

(10) Patent No.: US 12,022,470 B2
(45) Date of Patent: *Jun. 25, 2024

(54) METHOD AND APPARATUS FOR MAPPING UPLINK CONTROL INFORMATION FOR CHANNEL STATE INFORMATION FEEDBACK

(71) Applicant: Samsung Electronics Co., Ltd., Suwon-si (KR)

(72) Inventors: Hoondong Noh, Suwon-si (KR); Hyojin Lee, Seoul (KR); Youngwoo Kwak, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 254 days.

This patent is subject to a terminal disclaimer.

(21) Appl. No.: 17/478,317

(22) Filed: Sep. 17, 2021

(65) Prior Publication Data

US 2022/0007359 A1    Jan. 6, 2022

Related U.S. Application Data

(63) Continuation of application No. 16/120,995, filed on Sep. 4, 2018, now Pat. No. 11,129,145.

(30) Foreign Application Priority Data

Sep. 12, 2017    (KR) .......................... 10-2017-0116570

(51) Int. Cl.
*H04W 72/21*    (2023.01)
*H03M 13/13*    (2006.01)
(Continued)

(52) U.S. Cl.
CPC ........... *H04W 72/21* (2023.01); *H03M 13/13* (2013.01); *H04B 7/0417* (2013.01);
(Continued)

(58) Field of Classification Search
CPC ... H03M 13/13; H04B 7/0417; H04B 7/0486; H04B 7/0626; H04L 1/0008;
(Continued)

(56) References Cited

U.S. PATENT DOCUMENTS 9,209,883 B2    12/2015    Ko et al.
11,129,145 B2 *    9/2021    Noh ...................... H04L 5/0057
(Continued)

FOREIGN PATENT DOCUMENTS

CN    103001679 A    3/2013
CN    103391156 A    11/2013
(Continued)

OTHER PUBLICATIONS

Ericsson, "i1,p Encoding on PUSCH and Single Beam Reporting in Advanced CSI," R1-1705562, 3GPP TSG RAN WG1 #88bis, Apr. 3-7, 2017.

(Continued)

*Primary Examiner* — Joseph E Avellino
*Assistant Examiner* — Mon Cheri S Davenport
(74) *Attorney, Agent, or Firm* — Jefferson IP Law, LLP

(57) ABSTRACT

The present disclosure relates to a communication method and system for converging a 5th-Ggeneration (5G) communication system for supporting higher data rates beyond a 4th-Generation (4G) system with a technology for Internet of Things (IoT). The present disclosure may be applied to intelligent services based on the 5G communication technology and the IoT-related technology, such as smart homes, smart buildings, smart cities, smart cars, connected cars, health care, digital education, smart retail, security, and safety services. A method of transmitting uplink control information in a wireless communication system is provided. The method includes receiving channel state information (CSI) feedback configuration information from a (Continued)

base station, generating (CSI) including at least one of a CSI reference signal resource indicator (CRI), a rank indicator (RI), a precoding matrix indicator (PMI), or a channel quality indicator (CQI) based on the CSI feedback configuration information, identifying an information sequence including the CSI, encoding the information sequence using a polar code, and transmitting the encoded information sequence to a base station. The CRI and the RI are placed before padding bits in the information sequence and the PMI and the CQI are placed after the padding bits in the information sequence.

24 Claims, 17 Drawing Sheets

(51) Int. Cl.
    *H04B 7/0417*    (2017.01)
    *H04B 7/0456*    (2017.01)
    *H04L 1/00*      (2006.01)
    *H04L 5/00*      (2006.01)
    *H04B 7/06*      (2006.01)

(52) U.S. Cl.
    CPC ......... *H04B 7/0486* (2013.01); *H04L 1/0073* (2013.01); *H04L 5/0057* (2013.01); *H04L 5/0094* (2013.01); *H04B 7/0626* (2013.01); *H04L 1/0008* (2013.01); *H04L 1/0041* (2013.01); *H04L 5/0053* (2013.01)

(58) Field of Classification Search
    CPC ... H04L 1/0041; H04L 1/0073; H04L 5/0053; H04L 5/0057; H04L 5/0094; H04W 72/0413
    See application file for complete search history.

(56) References Cited

U.S. PATENT DOCUMENTS

| | | |
|---|---|---|
| 2014/0086352 A1 | 3/2014 | Ko et al. |
| 2015/0098347 A1 | 4/2015 | Guo et al. |
| 2015/0341093 A1 | 11/2015 | Ji et al. |
| 2016/0204811 A1 | 7/2016 | Goela et al. |
| 2018/0317207 A1 | 11/2018 | Liao et al. |
| 2019/0082435 A1 | 3/2019 | Noh et al. |

FOREIGN PATENT DOCUMENTS

| | | |
|---|---|---|
| CN | 104641573 A | 5/2015 |
| CN | 105187101 A | 12/2015 |
| CN | 106537814 A | 3/2017 |
| EP | 2 898 606 A1 | 7/2015 |
| EP | 3 454 491 A1 | 3/2019 |
| IN | 105391479 A | 3/2016 |
| WO | 2013/038601 A1 | 3/2013 |
| WO | 2018/070738 A1 | 4/2018 |

OTHER PUBLICATIONS

Korean Office Action dated Apr. 20, 2022, issued in the Korean Application No. 10-2017-0116570.
Qualcomm Incorporated; On Type I and Type II CSI parameters encoding; 3GPP TSG RAN WG1 #90; R1-1713397; Aug. 21-25, 2017; Prague, Czech.
Ericsson; Summary on views on CSI reporting for Type I and Type II; 3GPP TSG-RAN WG1 #90; R1-1715181; Aug. 21-25, 2017; Prague, Czech.
Huawei et al.; Details of CSI reporting on PUCCH/PUSCH; 3GPP TSG RAN WG1 Meeting NR#3; R1-1715466; Sep. 18-21, 2017; Nagoya, Japan.
Spreadtrum Communications; Discussion on CSI reporting; 3GPP TSG RAN WG1 Meeting AH_NR#3; R1-1715515; Sep. 18-21, 2017; Nagoya, Japan.
International Search Report dated Dec. 10, 2018; International Appln. No. PCT/KR2018/010259.
European Search Report dated Feb. 12, 2019; European Appln. No. 18192767.4-1220.
Chinese Office Action dated Dec. 2, 2020, issued in Chinese Application No. 201811036454.9.
Intel Corporation; Sequence design for Polar code; 3GPP TSG RAN WG1 Meeting #88bis; R1-1704774; Apr. 4-7, 2017; Mar. 25, 2017; Spokane, USA.
Korean Office Action with English translation dated Sep. 1, 2023; Korean Appln. No. 10-2023-0003563.
Chinese Office Action with English translation dated Sep. 4, 2023; Chinese Appln. No. 202110850978.7.
Chinese Office Action with English translation dated Mar. 1, 2024; Chinese Appln. No. 202110850978.7.

* cited by examiner

FIG. 8
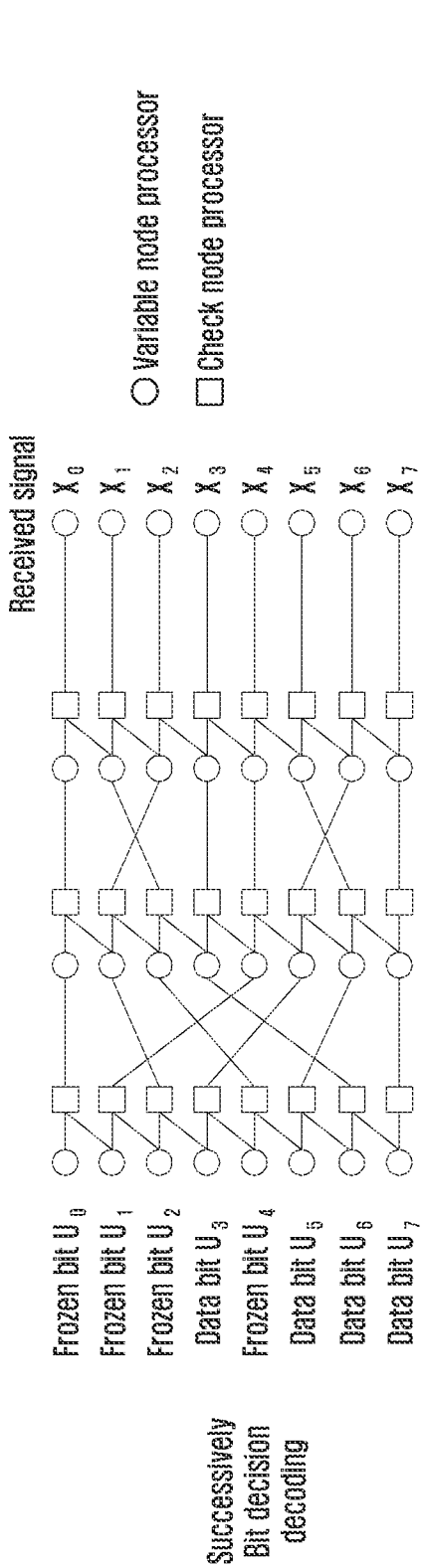
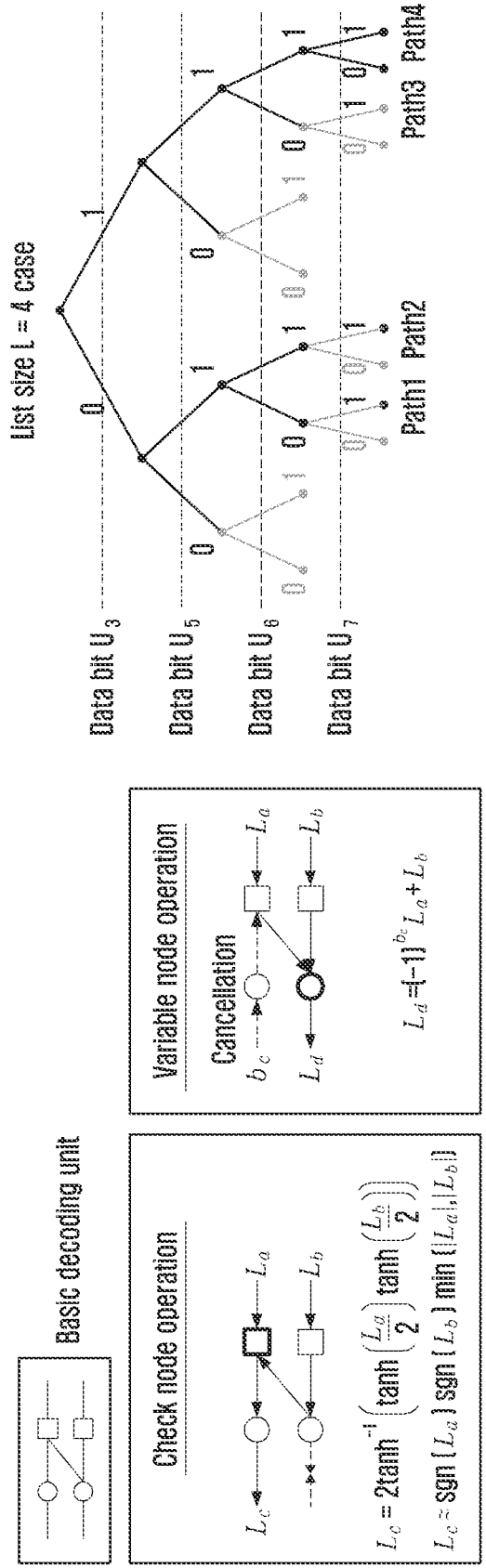

FIG. 10
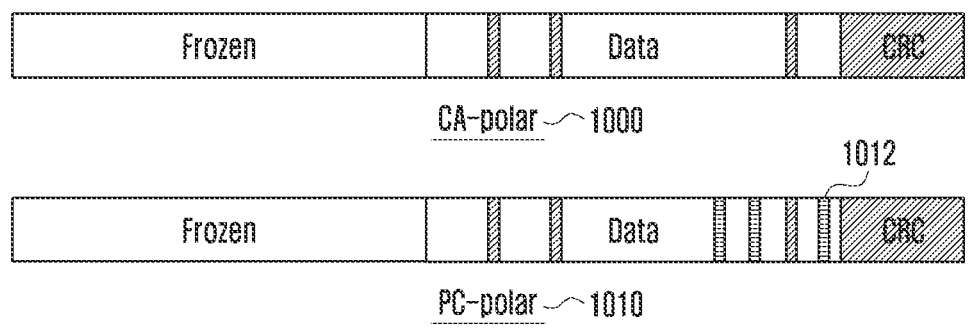
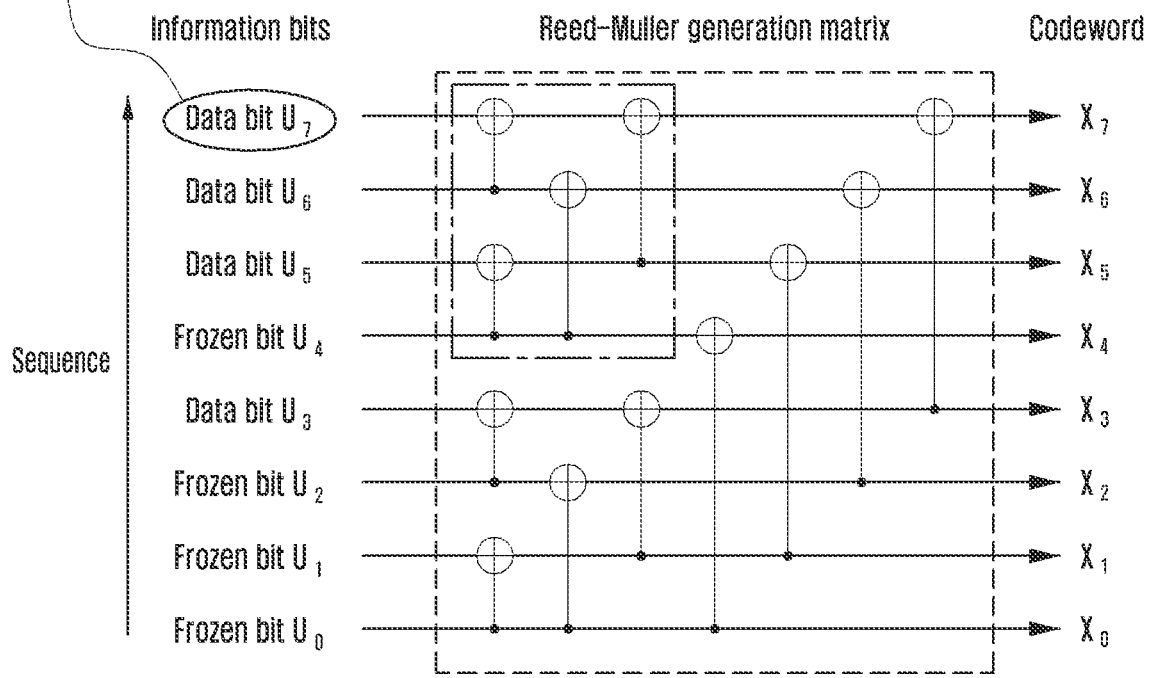

METHOD AND APPARATUS FOR MAPPING UPLINK CONTROL INFORMATION FOR CHANNEL STATE INFORMATION FEEDBACK

CROSS-REFERENCE TO RELATED APPLICATION(S)

The application is a continuation application of prior application Ser. No. 16/120,995 filed on Sep. 4, 2018, which has issued as U.S. Pat. No. 11,129,145 on Sep. 21, 2021; and which was based on and claimed priority under 35 U.S.C. § 119(a) of a Korean patent application number 10-2017-0116570 filed on Sep. 12, 2017, in the Korean Intellectual Property Office, the entire disclosure of each of which is incorporated by reference herein in its entirety.

BACKGROUND

1. Field

The disclosure relates to a wireless mobile communication system. More particularly, the disclosure relates to a method in which a terminal measures a radio channel state based on a plurality of reference signals, generates channel state information (CSI) based the measurement, and reports the CSI to a base station in a wireless mobile communication system.

2. Description of Related Art

To meet the demand for wireless data traffic having increased since deployment of 4th-generation (4G) communication systems, efforts have been made to develop an improved 5th-generation (5G) or pre-5G communication system. Therefore, the 5G or pre-5G communication system is also called a "Beyond 4G Network" or a "Post-LTE System." The 5G communication system is being considered to be implemented in higher frequency (mmWave) bands, e.g., 60 GHz band, to accomplish higher data rates. To decrease propagation loss of the radio waves and increase the transmission distance, the beamforming, massive multiple-input multiple-output (MIMO), full dimensional MIMO (FD-MIMO), array antennas, analog beam forming, and large scale antenna techniques are being discussed for 5G communication systems. In addition, in 5G communication systems, development for system network improvement is under way based on advanced small cells, cloud radio access networks (RANs), ultra-dense networks, device-to-device (D2D) communication, wireless backhaul, a moving network, cooperative communication, coordinated multi-points (CoMP), reception-end interference cancellation and the like. In the 5G system, hybrid FSK and QAM Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

The Internet, which is a human centered connectivity network where humans generate and consume information, is now evolving to the Internet of Things (IoT) where distributed entities, such as things, exchange and process information without human intervention. The Internet of Everything (IoE), which is a combination of the IoT technology and the Big Data processing technology through connection with a cloud server, has emerged. As technology elements, such as "sensing technology," "wired/wireless communication and network infrastructure," "service interface technology," and "Security technology" have been demanded for IoT implementation, a sensor network, a machine-to-machine (M2M) communication, machine type communication (MTC), and so forth have been recently researched. Such an IoT environment may provide intelligent Internet technology services that create a new value to human life by collecting and analyzing data generated among connected things. IoT may be applied to a variety of fields including smart homes, smart buildings, smart cities, smart cars or connected cars, smart grids, health care, smart appliances, and advanced medical services through convergence and combination between existing information technology (IT) and various industrial applications.

In line with this, various attempts have been made to apply 5G communication systems to IoT networks. For example, technologies such as a sensor network, MTC, and M2M communication may be implemented by beamforming, MIMO, and array antennas. Application of a cloud Radio Access Network (RAN) as the above-described Big Data processing technology may also be considered to be as an example of convergence between the 5G technology and the IoT technology.

As long term evolution (LTE) and LTE-Advanced have been developed recently, there is a desire for an uplink control information mapping method for reporting channel state information and an apparatus therefor.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a method of mapping uplink control information (UCI) so as to report channel state information. Particularly, the disclosure provides methods for overcoming the above-described problems by efficiently designing a UCI mapping rule for encoding a polar code of UCI.

Additional aspects will be set forth in part in the description which follows and, in part, will be apparent from the description, or may be learned by practice of the presented embodiments.

In accordance with an aspect of the disclosure, a method of transmitting uplink control information in a wireless communication system is provided. The method includes receiving channel state information (CSI) feedback configuration information from a base station, generating CSI including at least one of a CSI reference signal resource indicator (CRI), a rank indicator (RI), a precoding matrix indicator (PMI), or a channel quality indicator (CQI) based on the CSI feedback configuration information, identifying an information sequence including the CSI, encoding the information sequence using a polar code, and transmitting the encoded information sequence to the base station. The CRI and the RI are placed before padding bits in the information sequence and the PMI and the CQI are placed after the padding bits in the information sequence.

In accordance with another aspect of the disclosure, a method of receiving uplink control information in a wireless communication system is provided. The method includes transmitting channel state information (CSI) feedback configuration information to a terminal, receiving an encoded information sequence based on the CSI feedback configuration information from the terminal, and decoding the encoded information sequence using a polar code to identify an information sequence of the encoded information sequence. The information sequence consists of CSI in a sequence in which a CSI reference signal resource indicator (CRI) and a rank indicator (RI) are placed before padding bits and a precoding matrix indicator (PMI) and a channel quality indicator (CQI) are placed after the padding bits. The CSI includes at least one of the CRI, the RI, the PMI, or the CQI.

In accordance with another aspect of the disclosure, a terminal for transmitting uplink control information in a wireless communication system is provided. The terminal includes a transceiver, and at least one processor coupled to the transceiver and configured to control the transceiver to receive channel state information (CSI) feedback configuration information from a base station, generate CSI including at least one of CSI reference signal resource indicator (CRI), a rank indicator (RI), a precoding matrix indicator (PMI), or a channel quality indicator (CQI) based on the CSI feedback configuration information, identify an information sequence including the CSI, encode the information sequence using a polar code, and control the transceiver to transmit the encoded information sequence to the base station. The CRI and the RI are placed before padding bits in the information sequence and the PMI and the CQI are placed after the padding bits in the information sequence.

In accordance with another aspect of the disclosure, a base station for receiving uplink control information in a wireless communication system is provided. The base station includes a transceiver, and at least one processor coupled to the transceiver and configured to control the transceiver to transmit channel state information (CSI) feedback configuration information to a terminal, control the transceiver to receive an encoded information sequence based on the CSI feedback configuration information from the terminal, and decode the encoded information sequence using a polar code to identify an information sequence of the encoded information sequence. The information sequence consists of CSI in a sequence in which a CSI reference signal resource indicator (CRI) and a rank indicator (RI) are placed before padding bits and a precoding matrix indicator (PMI) and a channel quality indicator (CQI) are placed after the padding bits. The CSI includes at least one of the CRI, the RI, the PMI, or the CQI.

In accordance with another aspect of the disclosure, a terminal and a base station including a plurality of antennas may define a CSI mapping rule in consideration of a polar code sequence. Accordingly, various effects may be provided. The ambiguity of UCI encoding may be reduced when the terminal performs CSI reporting, and the number of times that a base station performs UCI blind decoding may be decreased and the base station efficiently identifies UCI.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 8 is a diagram illustrating a structure and an example of polar code decoding according to an embodiment of the disclosure;

FIG. 10 is a diagram illustrating an example of a CRC-aided (CA)-polar code and an example of a parity-check polar (PC-polar) code according to an embodiment of the disclosure;

The same reference numerals are used to represent the same elements throughout the drawings.

DETAILED DESCRIPTION

Figure 1:
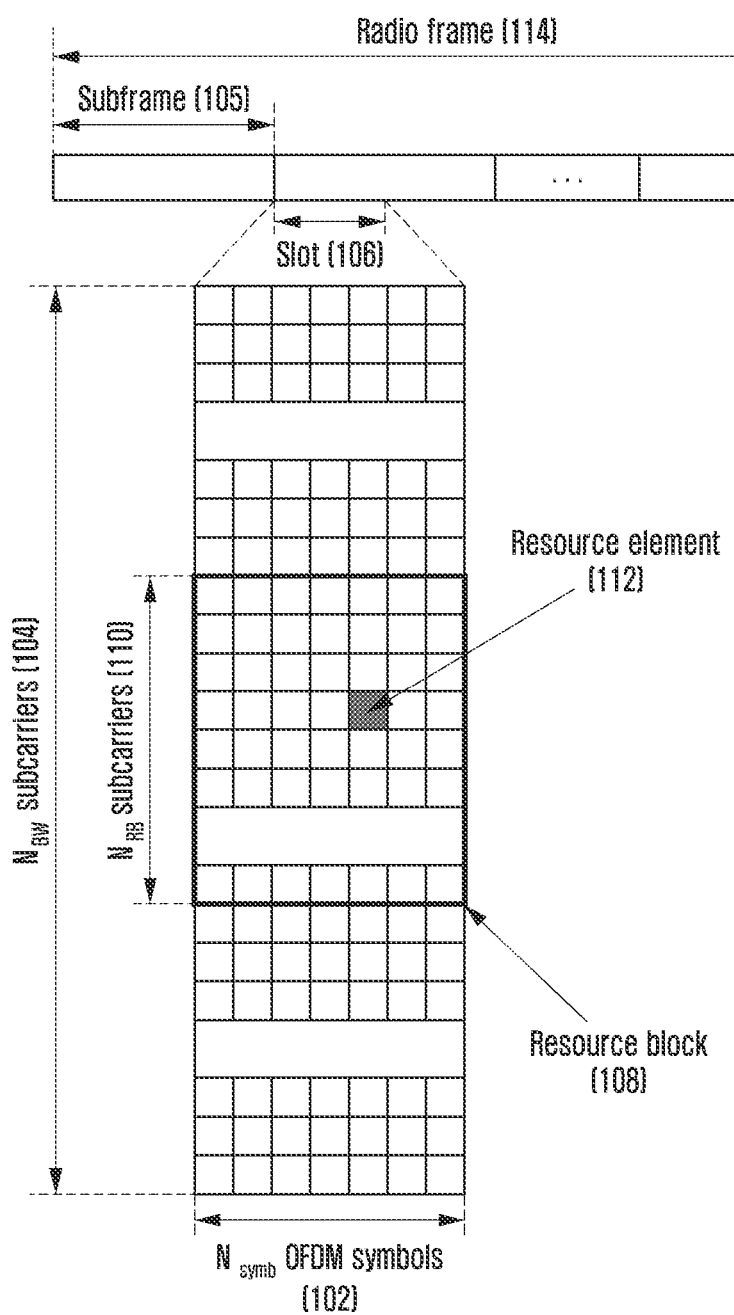
FIG. 1 is a diagram illustrating a downlink frame structure of a long-term evolution (LTE) and LTE-advanced (LTE-A) system according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The disclosure may have various modifications and various embodiments, among which specific embodiments will now be described more fully with reference to the accompanying drawings. However, it should be understood that there is no intent to limit the t disclosure to the particular forms disclosed, but on the contrary, the disclosure is to cover all modifications, equivalents, and alternatives falling within the spirit and scope of the disclosure.

Further, it will be appreciated that singular expressions such as "an" and "the" include plural expressions as well, unless the context clearly indicates otherwise. Accordingly, as an example, a "component surface" includes one or more component surfaces.

Although the terms including an ordinal number such as first, second, etc. can be used for describing various elements, the structural elements are not restricted by the terms. The terms are used merely for the purpose to distinguish an element from the other elements. For example, a first element could be termed a second element, and similarly, a second element could be also termed a first element without departing from the scope of the disclosure. As used herein, the term "and/or" includes any and all combinations of one or more associated items.

The terms used herein are used only to describe particular embodiments, and are not intended to limit the disclosure. As used herein, the singular forms are intended to include the plural forms as well, unless the context clearly indicates otherwise. In the disclosure, the terms such as "include" and/or "have" may be construed to denote a certain characteristic, number, step, operation, constituent element, component or a combination thereof, but may not be construed to exclude the existence of or a possibility of addition of one or more other characteristics, numbers, steps, operations, constituent elements, components or combinations thereof.

Hereinafter, a base station according to other embodiments of the disclosure is a subject of allocating resources to a terminal, and may be at least one of an evolved Node B (eNB), a Node B, a base station (BS), a radio access unit, a BS controller, and a node on a network. Hereinafter, a terminal according to embodiments of the disclosure may include a user equipment (UE), a mobile station (MS), a cellular phone, a smart phone, a computer, a multimedia system capable of performing a communication function, a small sensor including a communication function, a wearable device, or an Internet of things (IoT) device. Hereinafter, a downlink (DL) in various embodiments of the disclosure indicates a wireless transmission path of a signal that a base station transmits to a terminal. An uplink (UL) indicates a wireless transmission path of a signal that a terminal transmits to a base station. Also, hereinafter, although various embodiments of the disclosure are described from the perspective of a long-term evolution (LTE) system or an LTE-advanced (LTE-A) system, the various embodiments of the disclosure may be applicable to other communication systems which have similar background or channel forms, such as LTE-A Pro, new radio (NR), or the like. Also, various embodiments of the disclosure may be modified without departing from the scope of the disclosure, and may be applied to other communication systems, based on the determination by those skilled in the art.

Hereinafter, all the embodiments of the disclosure may not be exclusive, and one or more embodiments may be performed together. However, for ease of description, the embodiments and examples will be separately described.

A wireless communication system has developed to be a broadband wireless communication system that provides a high speed and high quality packet data service, like the communication standards, for example, high speed packet access (HSPA) of 3GPP, LTE or evolved universal terrestrial radio access (E-UTRA), LTE-A, high rate packet data (HRPD) of 3GPP2, ultra mobile broadband (UMB), and 802.16e of IEEE, or the like, beyond the voice-based service provided at the initial stage. Also, a communication standard of 5G or NR is being developed as a 5G wireless communication system.

An LTE system, which is a representative example of the broadband wireless communication system, employs an orthogonal frequency division multiplexing (OFDM) scheme for DL, and employs a single carrier frequency division multiple access (SC-FDMA) scheme for UL. In the multiple access schemes as described above, time-frequency resources for carrying data or control information are allocated and operated in a manner to prevent overlapping of the resources, that is, to establish the orthogonality, between users, so as to identify data or control information of each user.

When decoding fails at the initial transmission, the LTE system employs hybrid automatic repeat reQuest (HARQ) that retransmits the corresponding data in a physical layer. The HARQ refers to a scheme in which a receiver transmits information (e.g., negative acknowledgement (NACK) information) indicating the failure of decoding to a transmitter when the receiver fails to accurately decode data, so that the transmitter retransmits the corresponding data in a physical layer. The receiver may combine data retransmitted from the transmitter and previous data, decoding of which fails, whereby data reception performance may increase. Also, when the receiver accurately decodes data, the receiver transmits information (e.g., acknowledgement (ACK) information) reporting that decoding is successfully executed, so that the transmitter transmits new data.

FIG. 1 is a view illustrating a structure of the time-frequency domain, which is a radio resource region where data or a control channel is transmitted in a downlink of an LTE system, according to an embodiment of the disclosure.

Referring to FIG. 1, the horizontal axis indicates the time domain, and the vertical axis indicates the frequency domain. In the time domain, the minimum transmission unit is an OFDM symbol. One slot 106 includes $N_{symb}$ OFDM symbols 102, and one subframe 105 includes two slots. The length of one slot is 0.5 ms, and the length of one subframe is 1.0 ms. A radio frame 114 is a time domain section including 10 subframes. In the frequency domain, the minimum transmission unit is a subcarrier. The entire system transmission bandwidth may include a total of $N_{BW}$ subcarriers 104.

In the time-frequency domain, the basic resource unit is a resource element (RE) 112, and an RE is expressed by an OFDM symbol index and a subcarrier index. A resource block (RB) (or physical resource block (PRB)) 108 is defined by consecutive $N_{symb}$ OFDM symbols 102 in the time domain and $N_{RB}$ consecutive subcarriers 110 in the frequency domain. Therefore, one RB 108 includes $N_{symb} \times N_{RB}$ REs 112. Generally, the minimum transmission unit of data is an RB. In the LTE system, generally, $N_{symb}=7$ and $N_{RB}=12$. $N_{BW}$ is proportional to a system transmission bandwidth. A data rate increases in proportion to the number of RBs scheduled to a terminal.

In the LTE system, six transmission bandwidths are defined and used. In the case of a frequency division duplex (FDD) system that operates by distinguishing a downlink and an uplink by frequency, a downlink transmission bandwidth and an uplink transmission bandwidth may be different from each other. A channel bandwidth may indicate an RF bandwidth corresponding to a system transmission bandwidth. Table 1 provided below indicates a relationship between a system transmission bandwidth and a channel bandwidth defined in the LTE system. For example, when LTE system has a channel bandwidth of 10 MHz, the transmission bandwidth may include 50 RBs.

TABLE 1

| Channel bandwidth $BW_{Channel}$ [MHz] | 1.4 | 3 | 5 | 10 | 15 | 20 |
|---|---|---|---|---|---|---|
| Transmission bandwidth configuration $N_{RB}$ | 6 | 15 | 25 | 50 | 75 | 100 |

Downlink control information is transmitted within first N OFDM symbols in a subframe. Generally, N={1, 2, 3}. Therefore, the value of N may be changed for each subframe based on the amount of control information to be transmitted in the current subframe. The control information may include a control channel transmission interval indicator indicating the number of OFDM symbols via which control information is to be transmitted, scheduling information associated with downlink data or uplink data, a HARQ ACK/NACK signal, or the like.

In the LTE system, scheduling information associated with downlink data or uplink data may be transmitted from a base station to a terminal via downlink control information (DCI). The DCI are defined in various formats. A DCI format may be determined and applied for operation, based on whether scheduling information is for uplink data (UP grant) or for downlink data (DL grant), whether it is compact DCI of which the control information is small, whether spatial multiplexing using multiple antennas is applied, whether it is used for controlling power, and the like. For example, DCI format 1 corresponding to scheduling control information on DL grant may be configured to include at least the following control information.

Resource allocation type 0/1 flag: reports whether a resource allocation scheme is type 0 or type 1. Type 0 applies a bitmap scheme and allocates resources in units of resource block groups (RBGs). In the LTE system, a basic scheduling unit is an RB expressed by time and frequency domain resources, and an RBG includes a plurality of RBs and is used as a basic scheduling unit in the type 0 scheme. Type 1 allows allocation of a predetermined RB in an RBG.

Resource block assignment: reports an RB allocated to data transmission. A resource expressed is determined according to the system bandwidth and resource allocation scheme.

Modulation and coding scheme (MCS): reports a modulation scheme used for data transmission and the size of a transport block which is data to be transmitted.

HARQ process number: reports the process number of HARQ.

New data indicator: reports whether transmission is HARQ initial transmission or retransmission.

Redundancy version: reports the redundancy version of HARQ.

Transmit power control (TPC) command for physical uplink control channel (PUCCH): reports a TPC command for a PUCCH which is an uplink control channel.

The DCI goes through a channel coding and modulation process, and is transmitted via a physical downlink control channel (or control information, hereinafter interchangeably used) or an enhanced PDCCH (EPDCCH). The term "DCI transmission" may be interchangeably used with the term "PDCCH transmission," and the expression may be applied to another channel. For example, the term "downlink data reception" may be interchangeably used with the term "physical downlink shared channel (PDSCH) reception."

Generally, the DCI is scrambled with a predetermined radio network temporary identifier (RNTI) (or a terminal identifier), independently for each terminal, a cyclic redundancy check (CRC) is added, and channel coding is performed, whereby each independent PDCCH is configured and transmitted. In the time domain, a PDCCH is mapped and transmitted during the control channel transmission interval. The frequency domain mapping position of a PDCCH is determined by the identifier (ID) of each terminal, and is propagated to the entire system transmission band.

Downlink data is transmitted via a PDSCH, which is a physical channel for downlink data transmission. A PDSCH is transmitted after the control channel transmission interval. Scheduling information such as a modulation scheme, a specific mapping position in the frequency domain, or the like may be reported by DCI transmitted via a PDCCH.

Via an MCS formed of 5 bits in the control information included in the DCI, a base station may report the modulation scheme applied to a PDSCH to be transmitted to a terminal, and the size (transport block size (TBS)) of data to be transmitted. The TBS corresponds to the size of data (transport block (TB)) that the base station desires to transmit, before channel coding for error correction is applied to the data.

The modulation scheme supported by the LTE system includes quadrature phase shift keying (QPSK), 16 quadrature amplitude modulation (16QAM), and 64QAM. Modulation orders ($Q_m$) correspond to 2, 4, and 6 respectively. That is, in the case of the QPSK modulation, 2 bits are transmitted per symbol. In the case of the 16QAM modulation, 4 bits are transmitted per symbol. In the case of 64QAM modulation, 6 bits are transmitted per symbol.

Figure 2:
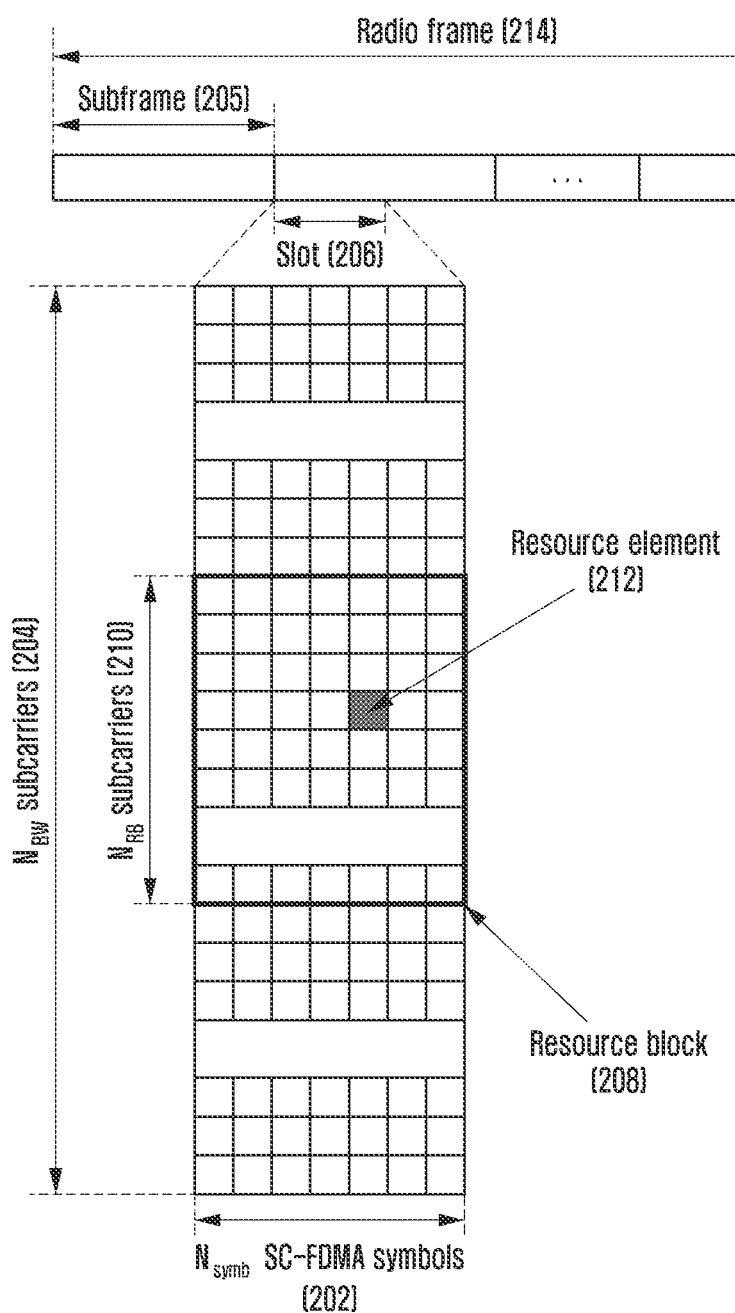
FIG. 2 is a diagram illustrating an uplink frame structure of an LTE and LTE-A system according to an embodiment of the disclosure.

FIG. 2 is a view illustrating a structure of the time-frequency domain, which is a radio resource region where data or a control channel is transmitted in an uplink of an LTE-A system according to an embodiment of the disclosure.

Referring to FIG. 2, the horizontal axis indicates the time domain, and the vertical axis indicates the frequency domain. A radio frame 214 may include 10 subframes. In the time domain, the minimum transmission unit is an SC-FDMA symbol and a single slot 206 includes $N_{symb}$ SC-FDMA symbols 202. A single subframe 205 includes two slots. In the frequency domain, the minimum transmission unit is a subcarrier. The entire system transmission bandwidth may include a total of $N_Bw$ subcarriers 204. $N_Bw$ has a value, which is proportional to a system transmission bandwidth.

In the time-frequency domain, the basic resource unit is a resource element (RE) 212, and an RE is defined by an SC-FDMA symbol index and a subcarrier index. An RB 208 is defined by $N_{symb}$ consecutive SC-FDMA symbols in the time domain and $N_{RB}$ consecutive sub-carriers 210 in the frequency domain. Therefore, a single RB includes $N_{symb} \times N_{RB}$ REs. In general, the minimum transmission unit of data or control information is an RB unit. A PUCCH is mapped to a frequency domain corresponding to 1 RB, and may be transmitted during one subframe.

In the LTE system, a timing relationship of a PUCCH or a physical uplink shared channel (PUSCH) needs to be defined, which is an uplink physical channel via which a HARQ ACK/NACK is transmitted, wherein the HARQ ACK/NACK corresponds to a PDCCH or an EPDCCH including a semi-persistent scheduling release (SPS release) or a PDSCH which is a physical channel for downlink data transmission. For example, in the LTE system operating according to frequency division duplex (FDD), an HARQ ACK/NACK corresponding to a PDCCH or EPDDCH including SPS release or a PDSCH transmitted in subframe (n−4) is transmitted via a PUCCH or a PUSCH in subframe n.

In the LTE system, a downlink HARQ adapts an asynchronous HARQ scheme in which a point in time for data retransmission is not fixed. That is, when a base station receives a HARQ NACK from a terminal as a feedback for initial transmission data that the base station transmits, the base station freely determines a point in time for retransmission data via a scheduling operation. For the HARQ operation, the terminal buffers data which is determined to be an error as a result of decoding received data, and combines the data and a subsequently retransmitted data.

When the terminal receives a PDSCH including downlink data transmitted from the base station in subframe n, the terminal transmits uplink control information including a HARQ ACK or NACK with respect to the downlink data via a PUCCH or a PUSCH in subframe (n+k). In this instance, k is defined differently according to FDD or time division duplex (TDD), and a subframe configuration thereof. For example, in the case of the FDD LTE system, k is fixed to 4. In the case of the TDD LTE system, k may be changed according to a subframe configuration and a subframe number.

In the LTE system, unlike downlink HARQ, uplink HARQ adapts a synchronous HARQ scheme in which a point in time for data transmission is fixed. That is, an uplink/downlink timing relationship among a PUSCH which is a physical channel for uplink data transmission, a PDCCH which is a downlink control channel coming before the PUSCH, and a physical hybrid indicator channel (PHICH) which is a physical channel via which a downlink HARQ ACK/NACK corresponding to the PUSCH are fixed according to the following rules.

When the terminal receives a PDCCH including uplink scheduling control information transmitted from the base station, or a PHICH via which a downlink HARQ ACK/ NACK is transmitted, in subframe n, the terminal transmits uplink data corresponding to the control information via a PUSCH in subframe (n+k). In this instance, k is defined differently according to FDD or TDD of the LTE system, and a configuration thereof. For example, in the case of the FDD LTE system, k is fixed to 4. In the case of the TDD LTE system, k may be changed according to a subframe configuration and a subframe number.

Further, when the terminal receives a PHICH carrying a downlink HARQ ACK/NACK from the base station in sub-frame i, the PHICH corresponds to a PUSCH transmitted by the terminal in sub-frame (i-k). In this instance, k is defined differently according to FDD or TDD of the LTE system, and a configuration thereof. For example, in the case of the FDD LTE system, k is fixed to 4. In the case of the TDD LTE system, k may be changed according to a subframe configuration and a subframe number.

The descriptions about the wireless communication system is provided from the perspective of an LTE system, and the disclosure is not limited to the LTE system and may be applicable to various wireless communication systems such as NR, 5G, or the like. For example, the waveform for uplink transmission in the NR is not limited to SC-FDMA, and cyclic prefix orthogonal frequency division multiplexing (CP-OFDM) is also available.

In the NR system, various slot structures are supported so as to flexibly cope with the amount of downlink and uplink capacity required, which vary according to the environment such as time, operation scenarios, or the like.

Figure 3:
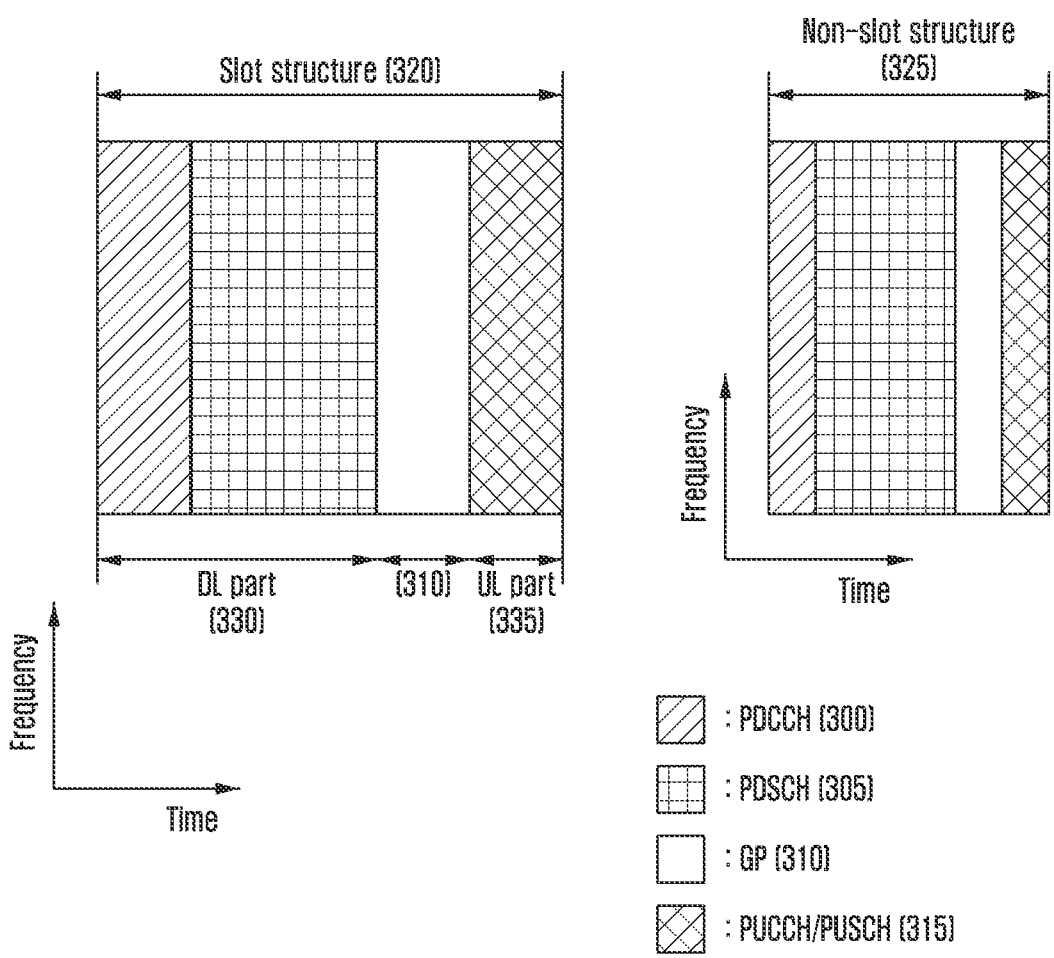
FIG. 3 is a diagram illustrating a slot structure and a non-slot structure of a new radio (NR) system according to an embodiment of the disclosure.

FIG. 3 is a diagram illustrating various NR slot structures supported in an NR system according to an embodiment of the disclosure.

Referring to FIG. 3, in NR, slots with various lengths may be set for terminals, and the set value may include at least one of a slot structure 320 including 14 (or 7) OFDM symbols and a non-slot structure 325 including 1, 2, . . . , or 7 OFDM symbols. The non-slot structure is an example of the expressions, and may be expressed by various terms such as "mini slot," "short slot," or the like.

As described above, a frequency and time resource region unit set as a slot structure or a non-slot structure may be divided, particularly from the perspective of the time axis, as a downlink structure (DL only), an uplink/downlink mixed structure (UL/DL mixed, which is similar to an LTE special subframe structure), and an uplink structure (UL only). In the example, descriptions will be provided from the perspective of the uplink/downlink mixed structure, which is the most general structure (DL only or UL only may be considered to be a special case of UL/DL mixed). According to the uplink/downlink mixed structure, at least one of a DL part 330, a guard period (GP) 310, and a UL part 335 are included in a slot structure or a non-slot structure. The DL part 330 may include at least one element from among a PDCCH 300, a PDSCH 305, and a DL reference signal (RS) such as a CSI-RS, a DL demodulation reference signal (DL DMRS), or the like. Similarly, the UL part 335 may include at least one element from among a PUCCH, a PUSCH 315, and a UL reference signal (UL RS) such as a sounding reference signal (SRS), a UL DMRS, or the like. Here, the guard period is a guard period for switching from DL to UL. During the guard period, a terminal may not need to perform data transmission and reception and thus, operations for UL/DL switching may be performed such as timing alignment or changing an RF chain.

Figure 4:
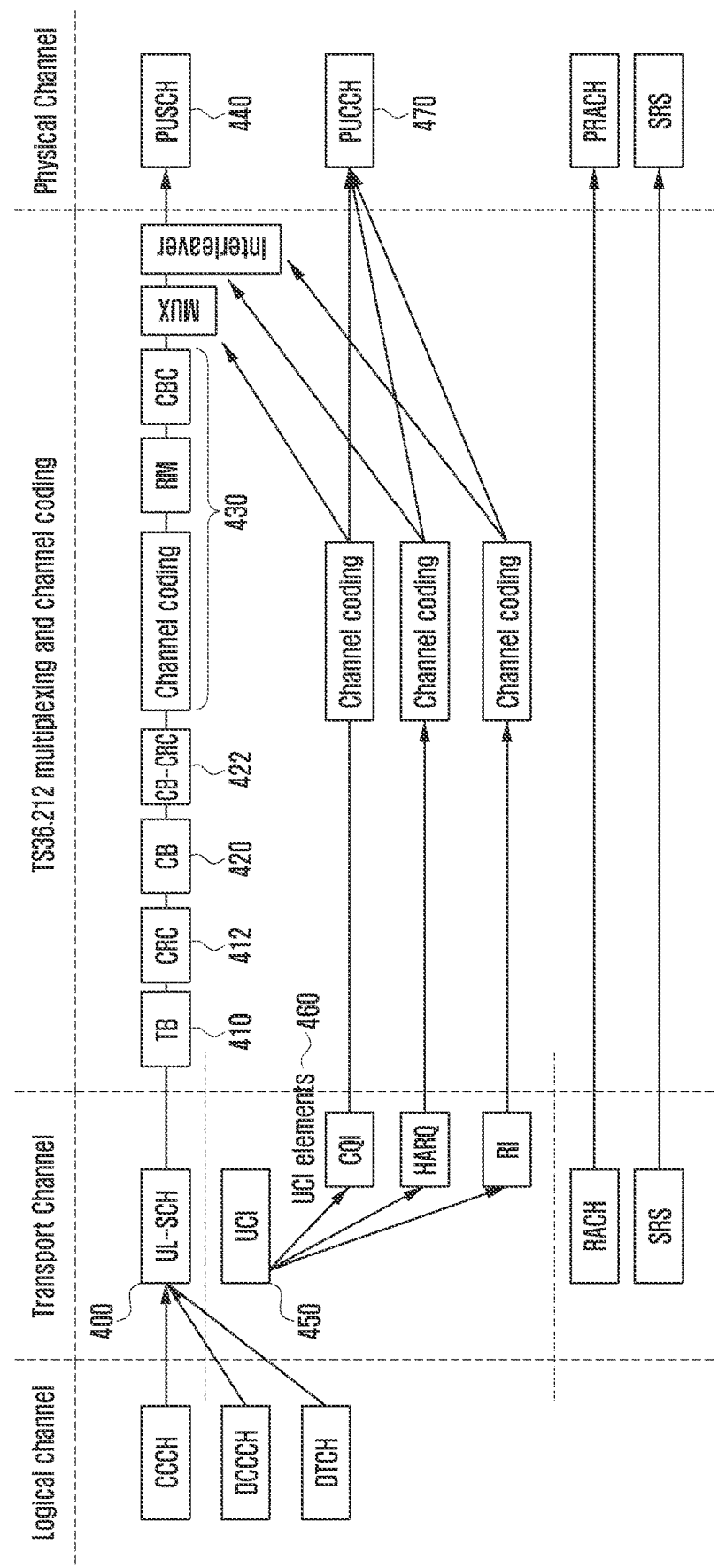
FIG. 4 is a diagram illustrating an uplink transmission structure of an LTE and LTE-A system according to an embodiment of the disclosure.

FIG. 4 is a diagram illustrating an uplink transmission structure of an LTE and LTE-A system according to an embodiment of the disclosure.

Referring to FIG. 4, an information bit transmitted in an uplink data channel (uplink shared channel (UL-SCH)) 400 in a transport channel may be divided in units of transport blocks (TBs) 410, and a TB cyclic redundancy check (CRC) bit 412 is added. Subsequently, TB and TB-CRC bits may be divided into at least one code block (CB) 420, and a CB-CRC 422 is added. Subsequently, the CB and CB-CRCs go through procedures such as channel coding, rate matching (RM), and code block concatenation (CBC) 430, and may be mapped to a physical uplink data channel (physical uplink shared channel (PUSCH)) 440.

In the transport channel, an uplink control channel (or uplink control information (UCI) 450) may include UCI elements 460 such as a HARQ, a rank indicator (RI), a CSI-RS resource indicator (CRI), a precoding matrix indicator (PMI), a channel quality indicator (CQI), or the like. One or more UCI elements may be separately encoded or jointly encoded according to a predetermined rule, and channel coding may be applied. A UCI to which channel coding is applied may be multiplexed to the uplink data channel and may be transmitted via a PUSCH or may be transmitted via a physical uplink control channel (PUCCH) 470.

In the NR system, CBs in a single TB may be divided into one or more code block groups (CBGs). In some cases, an HARQ ACK/NACK for each CBG may be reported and retransmission for each CBG may be performed. The remaining configurations are similar to those of the LTE system and LTE-A system.

As described above, in the LTE, LTE-A, and NR systems, a terminal measures a reference signal transmitted by a base station in downlink, and feeds back information obtained from the measurement to the base station via UCI. As UCI elements fed back by a terminal may briefly include five pieces of information as provided below.

CRI: the index of a CSI-RS resource that a terminal prefers from among CSI-RSs transmitted by a base station.

RI: the number of spatial layers that a terminal prefers in the current channel state.

PMI: the indicator of a precoding matrix that a terminal prefers in the current channel state.

CQI: indicates the maximum data transmission rate (data rate) of a terminal in the current channel state. CQI may be replaced with an SINR, the maximum error correction code rate, a modulation scheme, data efficiency per frequency, or the like, which may be utilized similarly to the maximum data transmission rate.

Channel state information (CSI) reference signal received power (CSI-RSRP) or synchronization signal block (SSB) reference signal received power (SSB RSRP): reception power of X CSI-RS(s) designated by a CRI or appointed in advance (e.g., X CSI-RS(s) having greatest reception power). SSB RSRP indicates reception power of an SSB indicated by a base station or reception power of X SSB(s) appointed in advance (e.g., X SSB(s) having the greatest reception power). In this instance, the reception power of an SSB may be defined as the reception power of one of a primary synchronization signal (PSS), a secondary synchronization signal (SSS), and a physical broadcast channel (PBCH), or the average reception power of some or all of them.

The CRI, RI, PMI, CQI, and RSRP are interrelated. For example, various CSI-RS resources set for a terminal may include a different number of CSI-RS ports. In this instance, the maximum allowable rank may not be greater than the number of CSI-RS ports, and thus, the maximum value of an RI that a terminal is capable of reporting may be determined based on a CRI selected by the terminal. As another example, a precoding matrix is defined differently for each rank. Accordingly, X, the value of a PMI when an RI has a value of 1 may be interpreted to be different from X, the value of a PMI when the RI has a value of 2. Also, when a terminal determines a CQI, the terminal assumes that a PMI and X that the terminal reports to a base station are applied in the base station. That is, reporting RI_X, PMI_Y, and CQI_Z to the base station may be the same as reporting that a data transmission rate corresponding to CQI_Z is received when a rank is RI_X and precoding is PMI_Y. As described above, when the terminal calculates a CQI, the terminal assumes a transmission scheme to be executed with respect to the base station, so that the terminal may obtain the optimal performance when the terminal actually executes transmission using the corresponding transmission scheme.

In LTE and LTE-A, a periodic feedback mode and an aperiodic feedback mode are supported. In NR, a periodic feedback mode, a semi-persistent feedback mode, and an aperiodic feedback mode are supported.

In LTE and LTE-A, periodic feedback may be set to one of the following four feedback modes (or reporting modes), based on information that is included.

1. Reporting mode 1-0: RI, wideband CQI (wCQI)

2. Reporting mode 1-1: RI, wCQI, PMI

3. Reporting mode 2-0: RI, wCQI, subband CQI (sCQI)

4. Reporting mode 2-1: RI, wCQI, sCQI, PMI

For the four feedback modes, a feedback timing of each information may be determined based on $N_{pd}$, $N_{OFFSET,CQI}$, $M_{RI}$, $N_{OFFSET,RI}$, and the like which are transferred via a higher layer signal. In feedback mode 1-0, the transmission period of the wCQI is $N_{pd}$, and a feedback timing may be determined based on a subframe offset value of $N_{OFFSET,CQI}$. Also, the transmission period of the RI is $N_{pd} \cdot M_{RI}$, and the offset thereof is $N_{OFFSET,CQI} + N_{OFFSET,RI}$.

Figure 5:
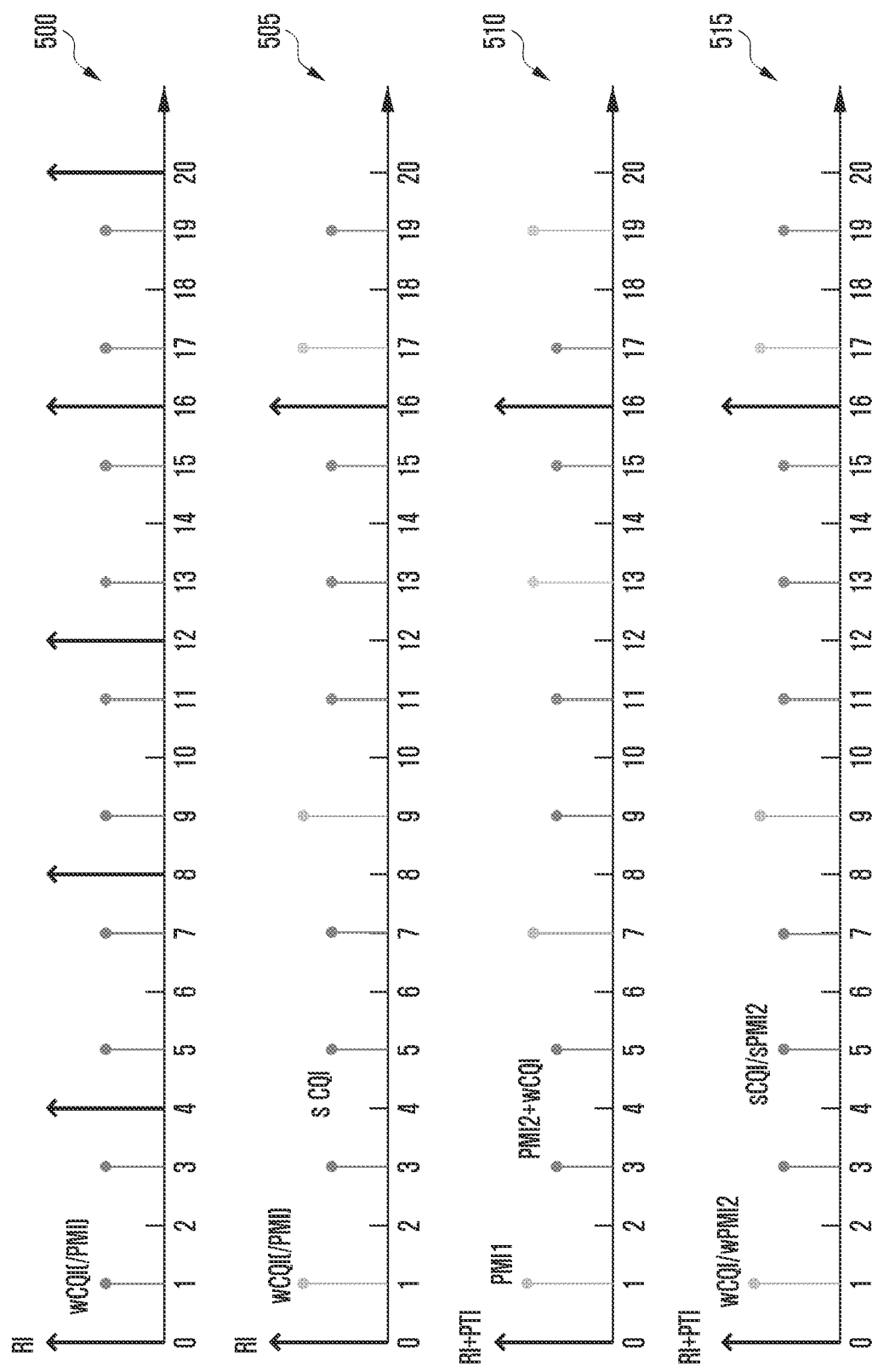
FIG. 5 is a diagram illustrating a physical uplink control channel (PUCCH)-based channel state information (CSI) report timing of an LTE and LTE-A system according to an embodiment of the disclosure.

FIG. 5 is a diagram illustrating a PUCCH-based CSI report timing in LTE and LTE-A system according to the reporting mode and the parameter setting according to an embodiment of the disclosure.

Referring to FIG. 5, each timing indicates a subframe index. For example, diagram 500 indicates the feedback timing of an RI and a wCQI when $N_{pd}=2$, $M_{RI}=2$, $N_{OFFSET,CQI}=1$, and $N_{OFFSET,RI}=-1$. Diagram 505 indicates the feedback timing of an RI, an sCQI, and a wCQI when $N_{pd}=2$, $M_{RI}=2$, J=3 (10 MHz), K=1, $N_{OFFSET,CQI}=1$, and $N_{OFFSET,RI}=-1$. Diagrams 510 and 515 are diagrams illustrating feedback timing when PTI=0 and PTI=1 in the case in which $N_{pd}=2$, $M_{RI}=2$, J=3 (10 MHz), K=1, H'=3, $N_{OFFSET,CQI}=1$, and $N_{OFFSET,RI}=-1$.

LTE and LTE-A may support aperiodic feedback, in addition to the periodic feedback of a terminal. When a base station desires to obtain aperiodic feedback information of a predetermined terminal, the base station may configure an aperiodic feedback indicator included in downlink control information (DCI) for uplink data scheduling of the corresponding terminal to execute predetermined aperiodic feedback, and executes uplink data scheduling of the corresponding terminal. When the terminal receives, in an $n^{th}$ subframe, the indicator that is configured to execute aperiodic feedback, the terminal may execute uplink transmission by including aperiodic feedback information in data transmission in an $n+k^{th}$ subframe. Here, k is a parameter defined in the 3GPP LTE Release 11 standard, which is 4 in the frequency division duplexing (FDD) and may be defined as shown in Table 2 in the TDD.

TABLE 2 k for each subframe number n in TDD UL/DL configuration

| TDD UL/DL Configuration | 0 | 1 | 2 | 3 | 4 | 5 | 6 | 7 | 8 | 9 |
|---|---|---|---|---|---|---|---|---|---|---|
| 0 | 4 | 6 |   |   |   | 4 | 6 |   |   |   |
| 1 |   | 6 |   |   | 4 | 6 |   |   | 4 |   |
| 2 |   |   |   | 4 |   |   |   | 4 |   |   |
| 3 | 4 |   |   |   |   |   |   | 4 | 4 |   |
| 4 |   |   |   |   |   |   |   | 4 | 4 |   |
| 5 |   |   |   |   |   |   |   | 4 |   |   |
| 6 | 7 | 7 |   |   |   | 7 | 7 |   |   | 5 |

When the aperiodic feedback is set, the feedback information may include an RI, PMI, and CQI in the same manner as the periodic feedback, and the RI and the PMI may not be fed back based on a feedback configuration. The CQI may include both a wCQI and an sCQI, or may include only wCQI information.

Table 3 provided below shows a reporting type of periodic channel state reporting performed using a PUCCH, information reported for each reporting type, and the payload size of used information.

TABLE 3

PUCCH reporting type

| PUCCH Reporting Type | Reported | Mode State | Mode 1-1 (bits/BP) | Mode 2-1 (bits/BP) | Mode 1-0 (bits/BP) | Mode 2-0 (bits/BP) |
|---|---|---|---|---|---|---|
| 1 | Sub-band CQI | RI = 1 | NA | 4 + L | NA | 4 + L |
|   |   | RI > 1 | NA | 4 + 3 + L | NA | 4 + L |
| 1a | Sub-band CQI/ second PMI | 8 ports, RI = 1 | NA | 4 + 4 + L | NA | NA |
|   |   | 8 ports, 1 < RI < 5 | NA | 4 + 2 + 3 + L | NA | NA |
|   |   | 8 ports, RI > 4 | NA | 4 + 3 + L | NA | NA |
| 2 | Wideband CQI/PMI | 2 ports, RI = 1 | 4 + 2 | 4 + 2 | NA | NA |
|   |   | 4 ports, RI = 1 | 4 + 4 | 4 + 4 | NA | NA |
|   |   | 2 ports, RI > 1 | 4 + 1 + 3 | 4 + 1 + 3 | NA | NA |
|   |   | 4 ports, RI > 1 | 4 + 4 + 3 | 4 + 4 + 3 | NA | NA |
| 2a | Wideband first PMI | 8 ports, RI | NA | 4 | NA | NA |
|   |   | 8 ports, 2 < RI < 8 | NA | 2 | NA | NA |
|   |   | 8 ports, RI = 8 | NA | 0 | NA | NA |
| 2b | Wideband CQI/ second PMI | 8 ports, RI = 1 | 4 + 4 | 4 + 4 | NA | NA |
|   |   | 8 ports, 1 < RI < 4 | 4 + 4 + 3 | 4 + 4 + 3 | NA | NA |
|   |   | 8 ports, RI = 4 | 4 + 3 + 3 | 4 + 3 + 3 | NA | NA |
|   |   | 8 ports, RI > 4 | 4 + 3 | 4 + 3 | NA | NA |
| 2c | Wideband CQI/ first PMI/ second PMI | 8 ports, RI = 1 | 4 (CQI) + 4 (PMI) | NA | NA | NA |
|   |   | 8 ports, 1 < RI ≤ 4 | 4 (CQI) + 4 (PMI) + 3 (spatial differential CQI) | NA | NA | NA |
|   |   | 8 ports, 4 < RI ≤ 7 | 4 (CQI) + 2 (PMI) + 3 (spatial differential CQI) | NA | NA | NA |
|   |   | 8 ports, RI = 8 | 4 (CQI) + 3 (spatial differential CQI) | NA | NA | NA |
| 3 | RI | 2/4 ports, 2-layer SM | 1 | 1 | 1 | 1 |
|   |   | 8 ports, 2-layer SM | 1 | NA | NA | NA |
|   |   | 4 ports, 4-layer SM | 2 | 2 | 2 | 2 |
|   |   | 8 ports, 4-layer SM | 2 | NA | NA | NA |
|   |   | 8-layer SM | 3 | NA | NA | NA |
| 4 | Wideband CQI | RI = 1 or RI > 1 | NA | NA | 4 | 4 |
| 5 | RI/first PMI | 8 ports, 2-layer SM | 4 (jointly coded RI and first PMI) | NA | NA | NA |
|   |   | 8 ports, 4 and 8 layer SM | 5 (jointly coded RI and first PMI) | NA | NA | NA |

TABLE 3-continued

| | | | PUCCH Reporting Modes | | | |
|---|---|---|---|---|---|---|
| PUCCH Reporting Type | Reported | Mode State | Mode 1-1 (bits/BP) | Mode 2-1 (bits/BP) | Mode 1-0 (bits/BP) | Mode 2-0 (bits/BP) |
| 6 | RI/PTI | 8 ports, 2-layer SM | NA | 1 + 1 (PTI) | NA | NA |
| | | 8 ports, 4-layer SM | NA | 2 + 1 (PTI) | NA | NA |
| | | 8 ports, 8-layer SM | NA | 3 + 1 (PTI) | NA | NA |

A terminal transmits RI, PTI, PMI, and CQI information using a PUCCH reporting type suitable for a reporting instance and a PUCCH reporting mode of periodic channel state reporting, as shown in Table 3. However, in the case of periodic channel state reporting using a PUCCH, the payload size to be transmitted and the amount of resources allocated are limited, and thus, the terminal may be allowed to perform transmission via only a single PUCCH reporting type for each point in time for reporting.

Therefore, when points in time for reporting collide between CSI processes in one cell, or when points in time for reporting collide between different cells in the state of carrier aggregation (CA), priority may be determined based on a PUCCH reporting type so as to solve the collision problem. In this instance, a criterion for determining priority is a reporting period. As a reporting period is long, corresponding information is important and has high priority. As a reporting period is short, corresponding information has low priority. In the release 12 standard, priority is determined based on a reporting type in order of RI>wideband PMI>wideband CQI>subband PMI and CQI. When reporting having same priority collide between different cells, a terminal transmits information associated with a cell having a low cell index, so as to solve the collision problem. Also, when predetermined information is not reported due to collision, remaining periodic channel state reporting is continued using most recently reported corresponding information as the predetermined information. For example, when wideband PMI information is not reported and a most recently reported wideband PMI is 0, a terminal assumes that the wideband PMI is also 0 at the current point in time for reporting, and continues reporting the remaining second PMI and CQI information.

LTE and LTE-A may provide a codebook subsampling function for periodic channel state reporting. In LTE and LTE-A, a periodic feedback of the terminal may be transmitted to a base station via a PUCCH. The amount of information that may be transmitted via a PUCCH in each time is limited, and thus, various feedback objects, such as an RI, a wCQI, an sCQI, a PMI1, a wPMI2, an sPMI2, and the like, may be transmitted via a PUCCH after subsampling, or two or more pieces of feedback information may be jointly encoded and transmitted via a PUCCH.

As an example, when the number of CSI-RS ports set by a base station is 8, an RI and a PMI1($i_1$) reported in submode 1 of PUCCH mode 1-1 may be jointly encoded as shown in Table 4. Referring to Table 4, an RI formed of 3 bits and a PMI1 formed of 4 bits are jointly encoded, such that a total of 5 bits of information is obtained. In submode 2 of PUCCH mode 1-1, a PMI1 formed of 4 bits and a PMI2($i_2$) formed of another 4 bits are jointly encoded, such that a total of 4 bits of information is obtained, as shown in Table 5. Since a subsampling scale is larger than that of submode 1 (7 bits are subsampled to 5 bits in submode 1 and 8 bits are subsampled to 4 bits in submode 2), more precoding indices may not be reported.

As another example, when the number of CSI-RS ports set by a base station is 8, a PMI2 reported in PUCCH mode 2-1 may be subsampled as shown in Table 6. Referring to Table 6, a PMI2 may be reported in 4 bits when a related RI is 1. However, when the related RI has a value greater than or equal to 2, a differential CQI for a second codeword needs to be additionally reported and thus, the PMI2 may be subsampled to 2 bits and may be reported. In LTE and LTE-A, subsampling or joint encoding may be applied to a total of 6 types of periodic feedbacks, including Table 4, Table 5 and Table 6.

TABLE 4

Joint encoding of RI and $i_1$ for PUCCH mode 1-1 submode 1

| Value of joint encoding of RI and the first PMI $I_{RI/PMI1}$ | RI | Codebook index $i_1$ |
|---|---|---|
| 0-7 | 1 | $2I_{RI/PMI1}$ |
| 8-15 | 2 | $2(I_{RI/PMI1}-8)$ |
| 16-17 | 3 | $2(I_{RI/PMI1}-16)$ |
| 18-19 | 4 | $2(I_{RI/PMI1}-18)$ |
| 20-21 | 5 | $2(I_{RI/PMI1}-20)$ |
| 22-23 | 6 | $2(I_{RI/PMI1}-22)$ |
| 24-25 | 7 | $2(I_{RI/PMI1}-24)$ |
| 26 | 8 | 0 |
| 27-31 | reserved | NA |

TABLE 5

Joint encoding of RI, $i_1$ and $i_2$ for PUCCH mode 1-1 submode 2

| | Relationship between the first PMI value and codebook index $i_1$ | | Relationship between the second PMI value and codebook index $i_2$ | | |
|---|---|---|---|---|---|
| RI | Value of the first PMI $I_{PMI1}$ | Codebook index $i_1$ | Value of the second PMI $I_{PMI2}$ | Codebook index $i_2$ | total # bits |
| 1 | 0-7 | $2I_{PMI1}$ | 0-1 | $2I_{PMI2}$ | 4 |
| 2 | 0-7 | $2I_{PMI1}$ | 0-1 | $I_{PMI2}$ | 4 |
| 3 | 0-1 | $2I_{PMI1}$ | 0-7 | $4\lfloor I_{PMI1}/4 \rfloor + I_{PMI2}$ | 4 |
| 4 | 0-1 | $2I_{PMI1}$ | 0-7 | $I_{PMI2}$ | 4 |
| 5 | 0-3 | $I_{PMI1}$ | 0 | 0 | 2 |

TABLE 5-continued

Joint encoding of RI, $i_1$ and $i_2$ for PUCCH mode 1-1 submode 2

| | Relationship between the first PMI value and codebook index $i_1$ | | Relationship between the second PMI value and codebook index $i_2$ | | |
|---|---|---|---|---|---|
| RI | Value of the first PMI $I_{PMI1}$ | Codebook index $i_1$ | Value of the second PMI $I_{PMI2}$ | Codebook index $i_2$ | total # bits |
| 6 | 0-3 | $I_{PMI1}$ | 0 | 0 | 2 |
| 7 | 0-3 | $I_{PMI1}$ | 0 | 0 | 2 |
| 8 | 0 | 0 | 0 | 0 | 0 |

TABLE 6

PUCCH mode 2-1 codebook subsampling

| | Relationship between the second PMI value and codebook index $i_2$ | |
|---|---|---|
| RI | Value of the second PMI $I_{PMI2}$ | Codebook index $i_2$ |
| 1 | 0-15 | $I_{PMI2}$ |
| 2 | 0-3 | $2I_{PMI2}$ |
| 3 | 0-3 | $8 \cdot \lfloor I_{PMI2}/2 \rfloor + (I_{PMI2} \bmod 2) + 2$ |
| 4 | 0-3 | $2I_{PMI2}$ |
| 5 | 0 | 0 |
| 6 | 0 | 0 |
| 7 | 0 | 0 |
| 8 | 0 | 0 |

In NR, periodic CSI reporting is transmitted via a short PUCCH or a long PUCCH. The short PUCCH includes one or two OFDM symbols. The long PUCCH includes three or four OFDM symbols. In the case of CSI reporting via a short PUCCH or a long PUCCH in NR, only single-slot reporting is supported, and multiplexing of CSI parameters (or UCI elements) among multiple slots is not supported unlike LTE and LTE-A. Through the above, multiple reporting time dependency for one CSI reporting may be reduced and performance deterioration caused by error propagation may be prevented.

Briefly three types of codebooks are supported in the NR system. The use of one of the three types of codebooks is indicated to a terminal via high layer signaling. A first type is a TypeI-SinglePanel codebook on the assumption of a single panel and a low CSI feedback resolution. A second type is a TypeI-MultiPanel codebook on the assumption of multiple panels and a low CSI feedback resolution. A third type is a TypeII codebook on the assumption of a single panel and a high CSI feedback resolution.

Each type of codebook may be defined by some or all of the following parameters.

$N_1$: the number of antenna ports in a first spatial domain.

$N_2$: the number of antenna ports in a second spatial domain (i.e., on the assumption of a dual-polarization antenna, the total number of antenna ports is $2*N_1*N_2$).

$O_1$: an oversampling factor in a first spatial domain (i.e., the number of code points allowed in the first spatial domain is $N_1*O_1$).

$O_2$: an oversampling factor in a second spatial domain (i.e., the number of code points allowed in the second spatial domain is $N_2*O_2$)

$N_g$: the number of panels in a multi-panel codebook.

$i_1$: indicates a first PMI, and represents beam group information or wideband PMI information. $i_1$ includes elements such as $i_{1,1}$, $i_{1,2}$, $i_{1,3}$, and the like. In this instance, $i_{1,1}$ is a first PMI for a first spatial domain. $i_{1,2}$ is a first PMI for a second spatial domain. $i_{1,3}$ is orthogonal vector direction information in a high rank codebook or the like.

$i_2$: indicates a second PMI, and includes information associated with beam selection from a beam group and/or co-phasing information.

L: the number of beams for beamforming, in TypeII codebook.

Also, in NR, each type of codebook may be set to one of two modes. A first mode is a mode in which one beam group includes one beam direction. In this instance, $i_2$ indicates only co-phasing information. A second mode is a mode in which one beam group includes one or more beam directions. In this instance, $i_2$ indicates beam selection information and co-phasing information.

In NR, payload listed in Tables provided below may be required to perform PMI reporting, according to settings associated with a codebook type, a parameter, a mode, or wideband/subband reporting. Table 7 lists $i_1$ payload (i.e., information associated with a wideband) for TypeI-SinglePanel codebook. Table 8 lists $i_2$ payload for each subband for TypeI-SinglePanel codebook.

TABLE 7

| | | Rank 1 | | Rank 2 | | | | |
|---|---|---|---|---|---|---|---|---|
| #ports | $(N_1, N_2)$ | Mode = 1 | Mode = 2 | Mode = 1 | Mode = 2 | Rank 3-4 | Rank 5-6 | Rank 7-8 |
| 2 | (1, 1) | — | — | — | — | — | — | — |
| 4 | (2, 1) | 3 | 2 | 4 | 3 | 3 | — | — |
| 8 | (2, 2) | 6 | 4 | 8 | 6 | 8 | 6 | 6 |
| | (4, 1) | 4 | 3 | 6 | 5 | 6 | 4 | 3 |
| 12 | (3, 2) | 7 | 5 | 9 | 7 | 9 | 7 | 6 |
| | (6, 1) | 5 | 4 | 7 | 6 | 7 | 5 | 5 |
| 16 | (4, 2) | 7 | 5 | 9 | 7 | 8 | 7 | 6 |
| | (8, 1) | 5 | 4 | 7 | 6 | 6 | 5 | 5 |
| 24 | (4, 3) | 8 | 6 | 10 | 8 | 9 | 8 | 8 |
| | (6, 2) | 8 | 6 | 10 | 8 | 9 | 8 | 7 |
| | (12, 1) | 6 | 5 | 8 | 7 | 7 | 6 | 6 |
| 32 | (4, 4) | 8 | 6 | 10 | 8 | 9 | 8 | 8 |
| | (8, 2) | 8 | 6 | 10 | 8 | 9 | 8 | 7 |
| | (16, 1) | 6 | 5 | 8 | 7 | 7 | 6 | 6 |

TABLE 8

| | Rank 1 | | Rank 2 | | | | |
|---|---|---|---|---|---|---|---|
| #ports | Mode = 1 | Mode = 2 | Mode = 1 | Mode = 2 | Rank 3-4 | Rank 5-6 | Rank 7-8 |
| 2 | 2 | — | 1 | — | — | — | — |
| >2 | 2 | 4 | 1 | 3 | 1 | 1 | 1 |

Table 9 lists $i_1$ payload (i.e., information associated with a wideband) for TypeI-MultiPanel codebook. Table 10 lists $i_2$ payload for each subband for TypeI-MultiPanel codebook.

TABLE 9

| # ports | $(N_g, N_1, N_2)$ | $(O_1, O_2)$ | Rank 1 Mode = 1 | Rank 1 Mode = 2 | Rank 2 Mode = 1 | Rank 2 Mode = 2 | Rank 3-4 Mode = 1 | Rank 3-4 Mode = 2 |
|---|---|---|---|---|---|---|---|---|
| 8 | (2, 2, 1) | (4, 1) | 5 | 7 | 6 | 8 | 5 | 7 |
| 16 | (2, 4, 1) | (4, 1) | 6 | 8 | 8 | 10 | 8 | 10 |
|  | (4, 2, 1) | (4, 1) | 9 | — | 10 | — | 9 | — |
|  | (2, 2, 2) | (4, 4) | 8 | 10 | 10 | 12 | 10 | 12 |
| 32 | (2, 8, 1) | (4, 1) | 7 | 9 | 9 | 11 | 9 | 11 |
|  | (4, 4, 1) | (4, 1) | 10 | — | 12 | — | 12 | — |
|  | (2, 4, 2) | (4, 4) | 9 | 11 | 11 | 13 | 11 | 13 |
|  | (4, 2, 2) | (4, 4) | 12 | — | 14 | — | 14 | — |

TABLE 10

| | Rank 1 | | Rank 2-4 | |
|---|---|---|---|---|
| # ports | Mode = 1 | Mode = 2 | Mode = 1 | Mode = 2 |
| 8,16,32 | 2 | 4 | 1 | 3 |

Table 11 lists $i_1$ payload (i.e., information associated with a wideband) for TypeII codebook. Tables 12 to 15 list $i_2$ payload for TypeII codebook. Particularly, Table 12 lists $i_2$ payload when a QPSK phase and a wideband-only amplitude are used for beamforming. Table 13 lists $i_2$ payload when a QPSK phase and a wideband-and-subband amplitude are used for beamforming. Table 14 lists $i_2$ payload when an 8-PSK phase and a wideband-only amplitude are used for beamforming. Table 15 lists $i_2$ payload when an 8-PSK phase and wideband and subband amplitude are used for beamforming.

TABLE 11

| #ports | $(N_1, N_2)$ | Rank 1 L = 2 | Rank 1 L = 3 | Rank 1 L = 4 | Rank 2 L = 2 | Rank 2 L = 3 | Rank 2 L = 4 |
|---|---|---|---|---|---|---|---|
| 4 | (2, 1) | 13 | — | — | 24 | — | — |
| 8 | (2, 2) | 18 | 24 | 28 | 29 | 42 | 52 |
|  | (4, 1) | 16 | 22 | 26 | 27 | 40 | 50 |
| 12 | (3, 2) | 15 | 27 | 32 | 26 | 45 | 56 |
|  | (6, 1) | 17 | 25 | 30 | 28 | 43 | 54 |
| 16 | (4, 2) | 20 | 28 | 35 | 31 | 46 | 59 |
|  | (8, 1) | 18 | 26 | 33 | 29 | 44 | 57 |
| 24 | (4, 3) | 22 | 30 | 37 | 33 | 48 | 61 |
|  | (6, 2) | 22 | 30 | 37 | 33 | 48 | 61 |
|  | (12, 1) | 20 | 28 | 35 | 31 | 46 | 59 |
| 32 | (4, 4) | 22 | 32 | 39 | 33 | 50 | 63 |
|  | (8, 2) | 22 | 32 | 39 | 33 | 50 | 63 |
|  | (16, 1) | 20 | 30 | 37 | 31 | 48 | 61 |

TABLE 12

| #ports | Rank 1 L = 2 | Rank 1 L = 3 | Rank 1 L = 4 | Rank 2 L = 2 | Rank 2 L = 3 | Rank 2 L = 4 |
|---|---|---|---|---|---|---|
| 4 | 6 | — | — | 12 | — | — |
| 8, 12, 16, 24, 32 | 6 | 10 | 14 | 12 | 20 | 28 |

TABLE 13

| #ports | Rank 1 L = 2 | Rank 1 L = 3 | Rank 1 L = 4 | Rank 2 L = 2 | Rank 2 L = 3 | Rank 2 L = 4 |
|---|---|---|---|---|---|---|
| 4 | 6 | — | — | 12 | — | — |
| 8, 12, 16, 24, 32 | 6 | 13 | 19 | 12 | 26 | 38 |

TABLE 14

| #ports | Rank 1 L = 2 | Rank 1 L = 3 | Rank 1 L = 4 | Rank 2 L = 2 | Rank 2 L = 3 | Rank 2 L = 4 |
|---|---|---|---|---|---|---|
| 4 | 9 | — | — | 18 | — | — |
| 8, 12, 16, 24, 32 | 9 | 15 | 21 | 18 | 30 | 42 |

TABLE 15

| #ports | Rank 1 L = 2 | Rank 1 L = 3 | Rank 1 L = 4 | Rank 2 L = 2 | Rank 2 L = 3 | Rank 2 L = 4 |
|---|---|---|---|---|---|---|
| 4 | 9 | — | — | 18 | — | — |
| 8, 12, 16, 24, 32 | 9 | 18 | 26 | 18 | 36 | 52 |

As listed in Tables 7 to 15, the payload of a PMI varies based on a set value related to each codebook and other UCI elements (e.g., a rank) reported together. That may indicate that a channel coding input sequence may vary according to a situation, and thus, this should be taken into consideration when short and long PUCCH encoding is performed.

In NR, 11 bits are used as a criterion. A Reed-Muller code is used for performing channel coding for DCI or UCI information bits with 11 or fewer bits, and a polar code is used for performing channel coding for DCI or UCI information bits with 12 or more bits. The information bits may be counted by taking into consideration only a UCI bit stream $a_0, a_1, a_2, a_3, \ldots, a_{A-1}$ having A bits, or may be counted by taking into consideration both a UCI bit stream $a_0, a_1, a_2, a_3, \ldots, a_{A-1}$ having A bits and parity bits $p_0, p_1, p_2, p_3, p_{L-1}$ having L bits.

Figure 6:
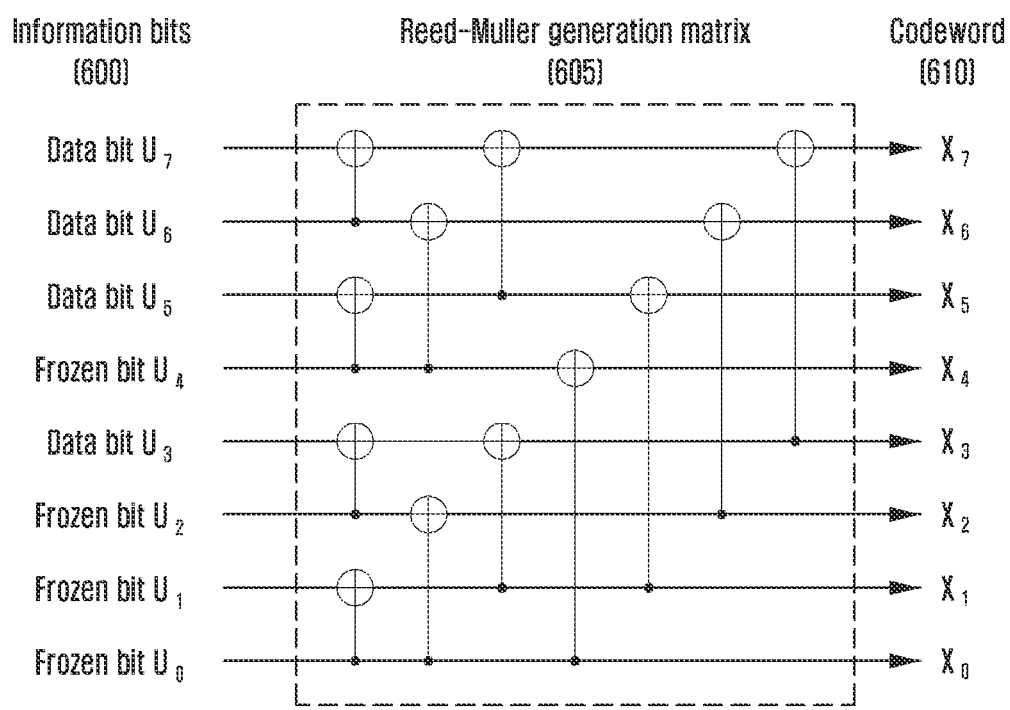
FIG. 6 is a diagram illustrating a structure of polar code encoding according to an embodiment of the disclosure.

FIG. 6 is a diagram illustrating an example of an encoding method of a polar code according to an embodiment of the disclosure.

Referring to FIG. 6, information bits 600 may be encoded by a predetermined Reed-Muller generation matrix 605, thereby being converted to codeword 610. In this instance, the information bits are encoded sequentially from $U_0$ to $U_7$.

As bits are lower bits, the number of jointly encoded bits is small, and thus, lower bits have lower reliability. Therefore, some of the lower bits are defined as frozen bits so as to use a predetermined sequence, and the remaining bits are used as data bits, whereby the decoding performance may be improved.

Figure 7:
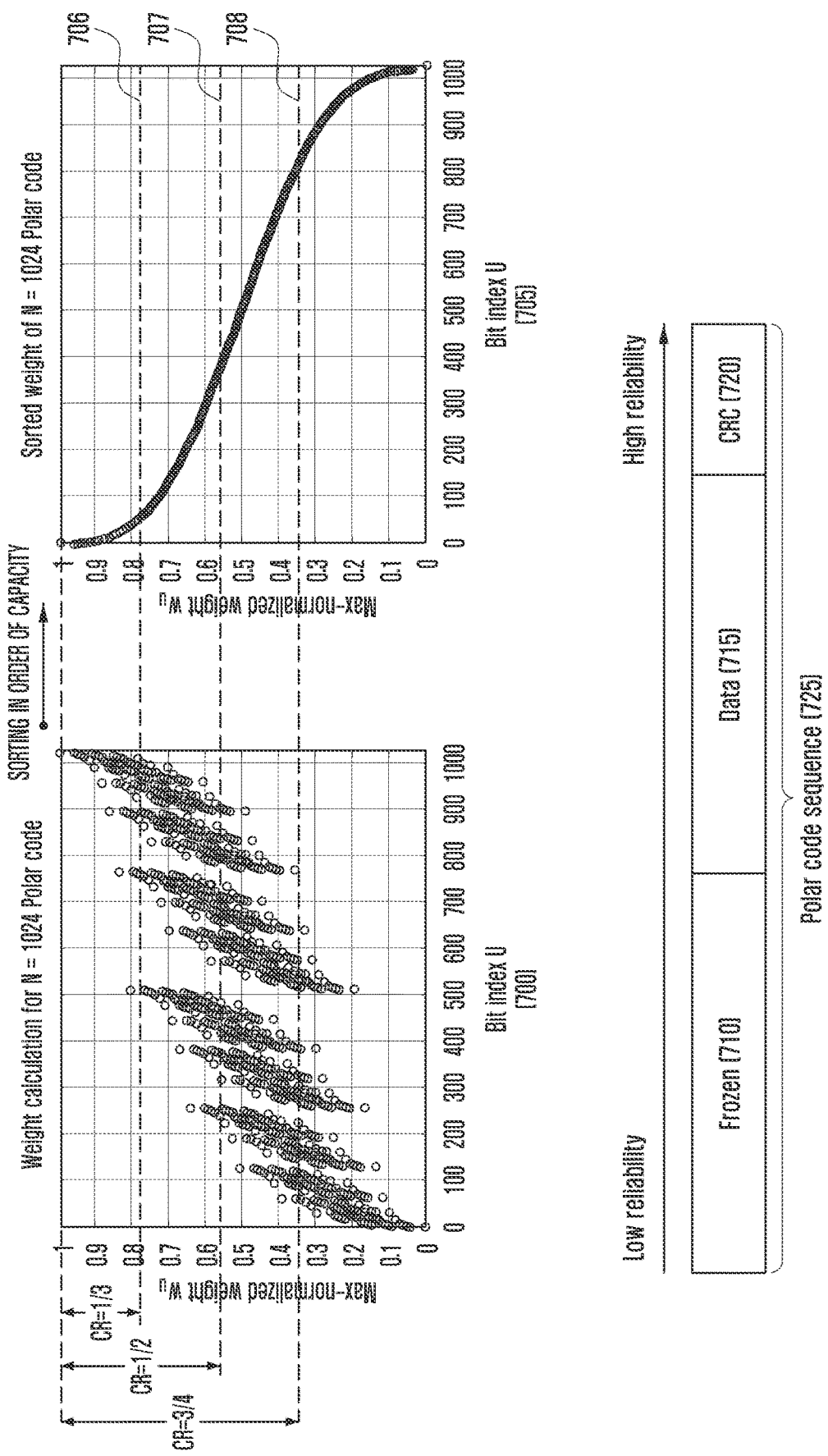
FIG. 7 is a diagram illustrating an example of a polar code sequence according to an embodiment of the disclosure.

FIG. 7 is a diagram illustrating an example of a polar code sequence according to an embodiment of the disclosure.

Referring to FIG. 7, it is recognized that decoding reliability increases according to an information bit index, as described in FIG. 6. Particularly, it is easily observed that the reliability in diagram 700 obtained before sorting, has a certain tendency, although the tendency is not a monotone increasing function or a monotone decreasing function unlike diagram 705 obtained after sorting. Referring to diagram 700, frozen bit indices (bits under the broken line 706, bits under the broken line 707, and bits under the broken line 708) and data bit indices (bits above the broken line 706, bits above the broken line 707, and bits above the broken line 708) may be distinguished based on a desired coding rate (CR) such as CR=1/3, CR=1/2, or CR=3/4, and that may be defined as a polar code sequence. When sorting is performed based on reliability for each bit, a polar code sequence 725 may include a frozen bit part 710 including bits having the lowest reliability, a data bit part 715 including bits having medium reliability, and a CRC part 720 having the highest reliability.

FIG. 8 is a diagram illustrating an example of polar code decoding according to an embodiment of the disclosure.

Referring to FIG. 8, a received signal in association with the polar code sequence may be decoded based on the above-described RM generation matrix. Decoding is performed by a receiving end including a plurality of basic decoding units in reverse order of reliability of respective information bits. Each basic decoding unit sequentially and continuously performs a log-likelihood ratio (LLR) operation for a corresponding node (check node operation), and successive cancelation based thereon (variable node operation). From the perspective of decoding of data bits, it may be schematically illustrated as the tree structure of FIG. 8.

Figure 9:
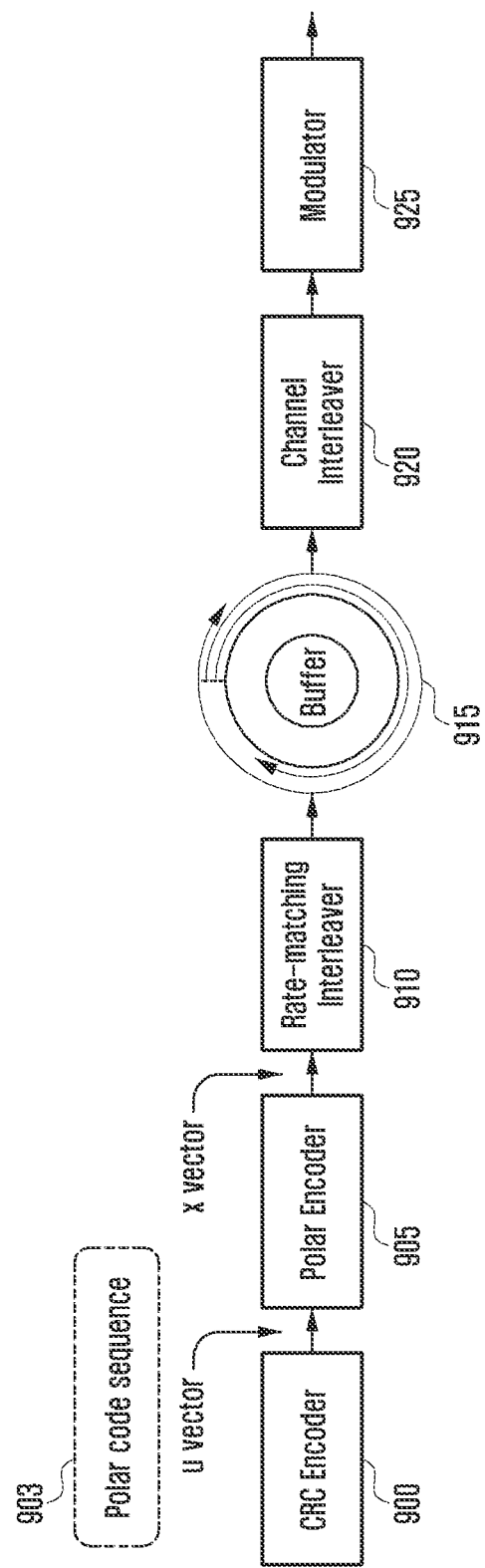
FIG. 9 is a diagram illustrating an example of a coding chain of polar code according to an embodiment of the disclosure.

FIG. 9 is a diagram illustrating an example of a channel coding chain based on a polar code according to an embodiment of the disclosure.

Referring to FIG. 9, DCI or UCI information may go through a CRC encoder 900 and may be converted into a polar code sequence 903. The polar code sequence 903 may go through a polar encoder 905 and may be changed into codeword, and rate matching is performed, in operation 910 (e.g., via a rate-matching interleaver). Subsequently, a rate-matched codeword in a circular buffer 915 sequentially go through channel interleaving, in operation 920 (e.g., via a channel interleaver), may be modulated in operation 925 (e.g., via a modulator), and may be mapped to a PDCCH or a PUCCH.

FIG. 10 is a diagram illustrating an example of a CRC-aided polar (CA-polar) code and an example of a parity-check polar (PC-polar) code according to an embodiment of the disclosure.

Referring to FIG. 10, generally, the performance of a polar code may be improved when candidate paths are checked using a CRC. This may be defined as CA-polar code 1000. In CA polar code, a CRC input and data needs to be defined to have an appropriate sequence and decoding complexity that is not higher than that of only polar code. A PC-polar code 1010 is a method of defining a PC-frozen bit 1012, in addition to a CRC. In this instance, the additional PC-frozen bit is not a fixed value, and may be changed by another data bit. For example, in FIG. 10, a PC-frozen bit for $U_7$ may be determined based on values of $U_5$ and $U_6$. The efficiency of a CA-polar code and a PC-polar code may be changed based on the payload of an information bit. The use of a CA-polar code and a PC-polar code may be determined based on a predetermined information bit payload. Subsequently, "polar code" used in the descriptions of the disclosure does not indicate a predetermined polar code, but indicates a general polar code.

As described above, in the NR system, for performing PDCCH and PUCCH channel coding, a Reed-Muller code is used for an information payload of 11 or fewer bits, and a polar code is used for an information payload of bits greater than 11 bits. When CSI reporting via a PUCCH is performed, a UCI payload may be changed based on some CSI values. For example, when the payload for PMI and CQI reporting may be changed based on a rank reported by a terminal. That may cause problems. Ambiguity may increase when a base station decodes UCI which has been encoded using a polar code, and the number of times that blind decoding is performed may be increased. Therefore, the disclosure provides a method of efficiently determining a UCI mapping rule for polar code encoding of UCI, thereby overcoming the above-described problems.

First Embodiment: Encoding in Order of CRI-RI-CQI-PMI-Padding

Figure 14:
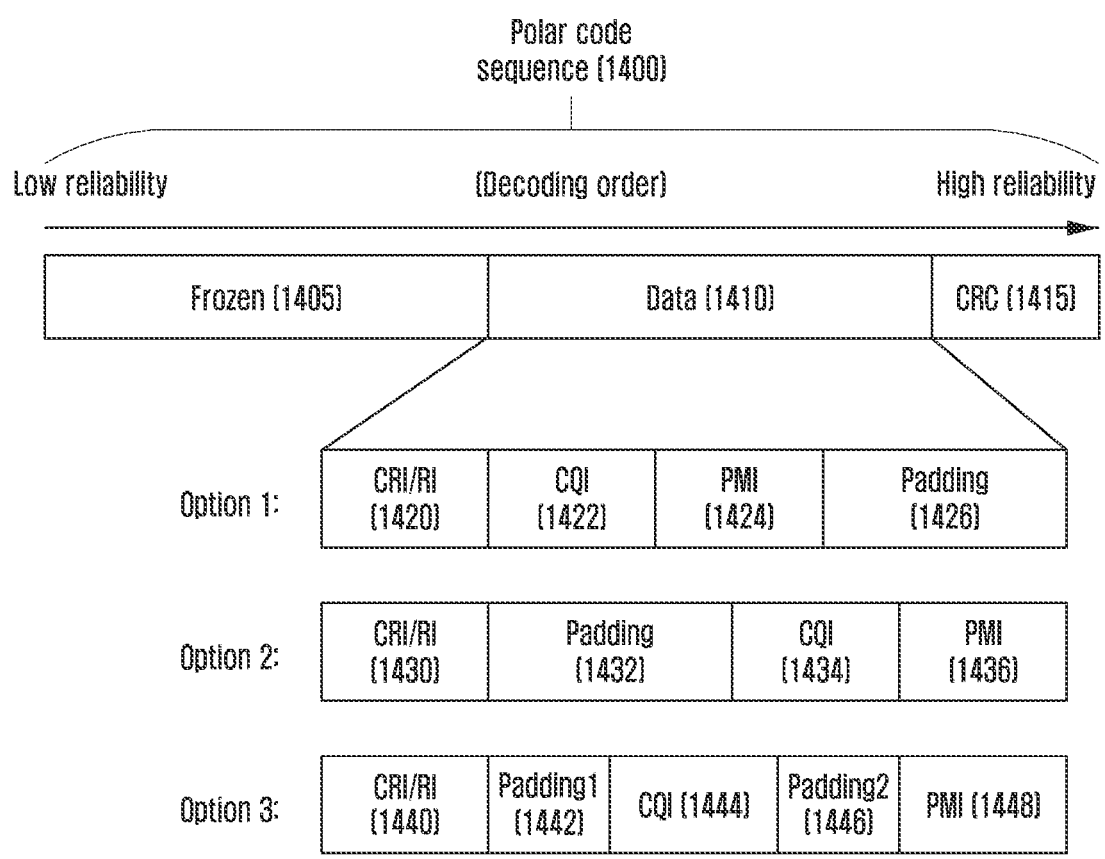
FIG. 14 is a diagram illustrating an example of generating a polar code sequence based on an RI according to an embodiment of the disclosure.

FIG. 14 is a diagram illustrating examples of a UCI mapping method in consideration of a polar code sequence according to an embodiment of the disclosure.

Referring to FIG. 14, in the first embodiment, it is appointed that UCI elements related to CSI reporting, such as a CRI/RI 1420, a PMI 1424, a CQI 1422, and the like are encoded before a padding bit 1426 is encoded. That is to remove ambiguity of the payload of UCI elements by decoding the UCI elements before decoding padding bits when a data bit part 1410 is decoded based on a frozen bit part 1405 in a polar code sequence 1400 including the frozen bit part 1405, the data bit part 1410, and a CRC 1415. The CRI/RI 1420 may be encoded before the CQI 1422 or the PMI 1424. In this instance, the CRI may be encoded before the RI is encoded. The number of CSI-RS ports included in a CSI-RS resource indicated by a CRI reported by a terminal is changed, and thus, the maximum allowed rank is changed. Accordingly, the payload of the RI may be changed. A base station may decode the CRI/RI 1420 and then, may estimate the payload of the CQI 1422 or the PMI 1424.

Figure 11:
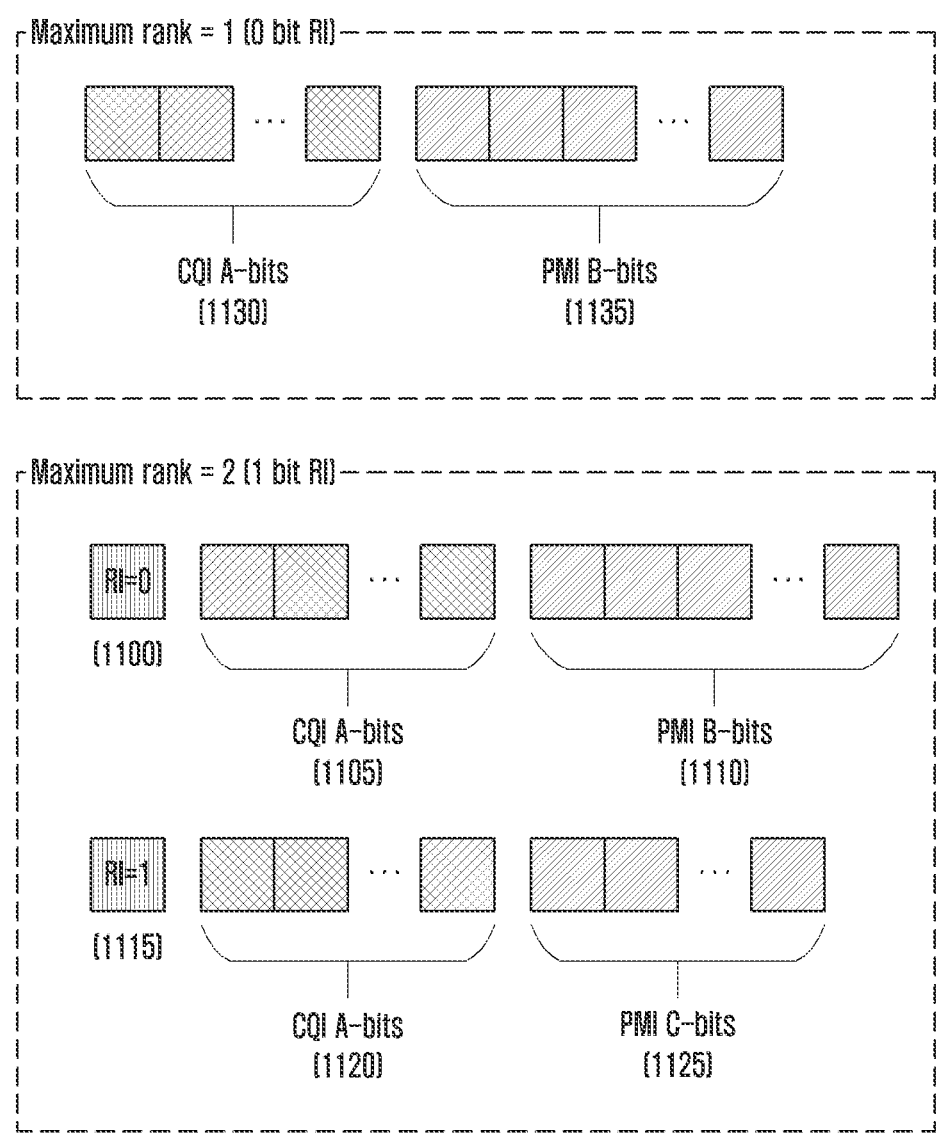
FIG. 11 is a diagram illustrating an example of CSI mapping when the maximum rank is 1 or 2 according to an embodiment of the disclosure.

FIG. 11 is a diagram illustrating an example of CSI mapping when the maximum rank is 1 or 2 according to an embodiment of the disclosure.

Referring to FIG. 11, when the maximum rank is determined as 1 by CRI decoding (when a CSI-RS resource indicated by a CRI includes a single CSI-RS port) or when the maximum rank is determined as 1 by higher layer signaling, a base station of FIG. 11 may be aware that the data bit part 1410 includes a CQI 1130 with A bits and a PMI 1135 with B bits. In this instance, the PMI 1135 with B bits may be determined with reference to PMI payload values provided in Tables 7 to 15. The remaining parts other than the CQI 1130 or the PMI 1135 in the data bit part 1410 may be filled with the padding bit 1426. Subsequently, the base station decodes the CRC 1415, and may determine whether entire polar code sequence decoding is successfully performed. In the case of rank 1, the CQI with A bits may represent the channel quality of a single codeword.

As another example, a base station may consider the case in which the maximum rank is determined as 2 by CRI decoding (i.e., when a CSI-RS resource indicated by a CRI includes two CSI-RS ports) or the case in which the maximum rank is determined as 2 by higher layer signaling. As illustrated in FIG. 11, when an RI decoding result shows that an RI 1100 is 0 (rank=1), it is recognized that the data bit part 1410 includes a CQI 1105 with A bits and a PMI 1110 with B bits. In this instance, the PMI 1110 with B bits may be determined with reference to PMI payload values provided in Tables 7 to 15. The remaining parts other than the RI/CRI 1100, the CQI 1105, or the PMI 1110 in the data bit part 1410 may be filled with the padding bit 1426.

When an RI 1115 is 1 (rank=2), it is recognized that the data bit part 1410 includes a CQI 1120 with A bits and a PMI 1125 with C bits. In this instance, the PMI 1125 with C bits may be determined with reference to PMI payload values provided in Tables 7 to 15. The remaining parts other than the RI/CRI 1115, the CQI 1120, or the PMI 1125 in the data bit part 1410 may be filled with the padding bit 1426. Subsequently, the base station decodes the CRC 1415, and may determine whether entire polar code sequence decoding is successfully performed. In either case whether rank=1 or rank=2, the CQI with A bits represents the channel quality of a single codeword. Therefore, payload of the CQI is not changed based on a rank. However, it should be taken into consideration that a PMI with B bits or C bits may be changed based on the rank.

Figure 12:
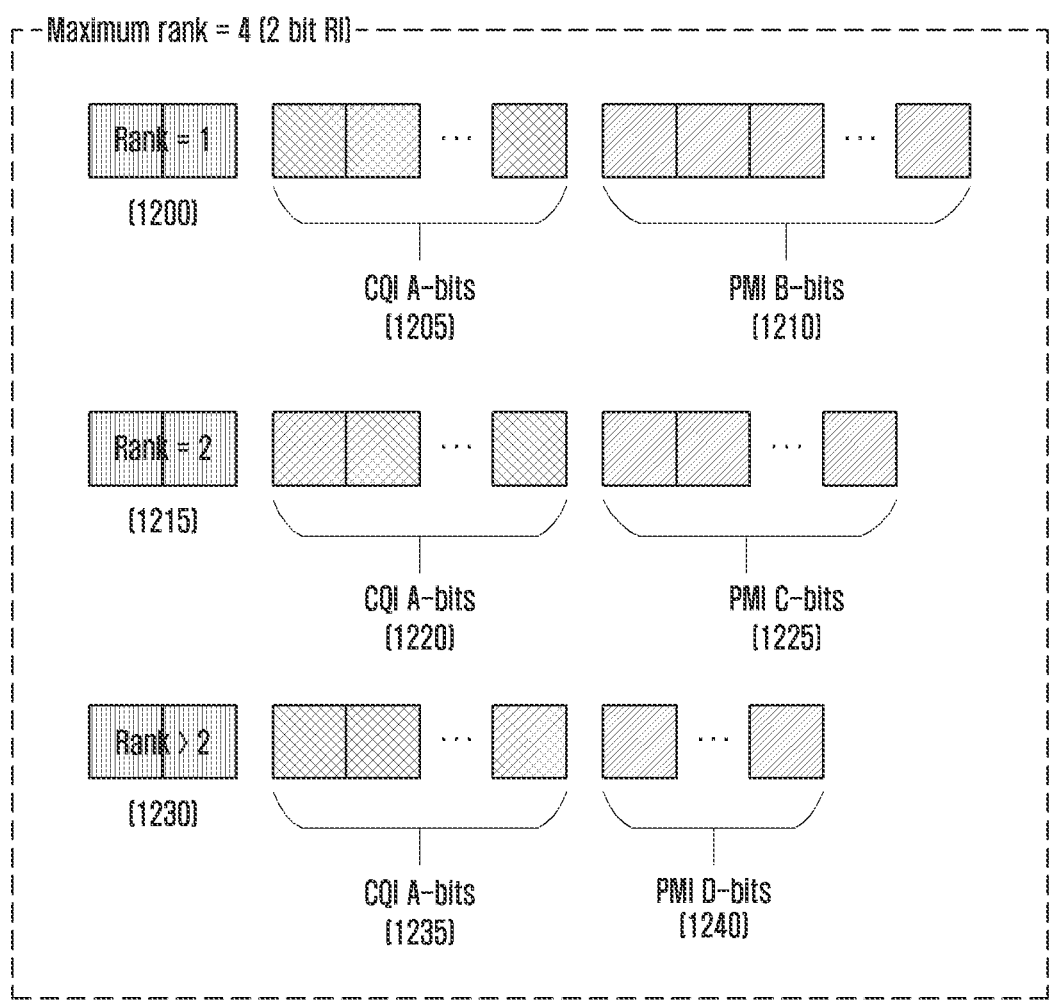
FIG. 12 is a diagram illustrating an example of CSI mapping when the maximum rank is 4 according to an embodiment of the disclosure.

FIG. 12 is a diagram illustrating an example of CSI mapping when the maximum rank is 4 according to an embodiment of the disclosure. As another example, a base station may consider the case in which the maximum rank is determined as 4 by CRI decoding (i.e., when a CSI-RS resource indicated by a CRI includes four CSI-RS ports) or the case in which the maximum rank is determined as 4 by higher layer signaling.

Referring to FIG. 12, when an RI decoding result shows that an RI 1200 is 00 (rank=1), it is recognized that the data bit part 1410 includes a CQI 1205 with A bits and a PMI 1210 with B bits. In this instance, the PMI 1210 with B bits may be determined with reference to PMI payload values provided in Tables 7 to 15. The remaining parts other than the RI/CRI 1200, the CQI 1205, or the PMI 1210 in the data bit part 1410 may be filled with the padding bit 1426.

When an RI 1215 is 01 (rank=2), it is recognized that the data bit part 1410 includes a CQI 1220 with A bits and a PMI 1225 with C bits. In this instance, the PMI 1225 with C bits may be determined with reference to PMI payload values provided in Tables 7 to 15. The remaining parts other than the RI/CRI 1215, the CQI 1220, or the PMI 1225 in the data bit part 1410 may be filled with the padding bit 1426. When an RI 1230 is 10 or 11 (rank=3 or 4), it is recognized that the data bit part 1410 includes a CQI 1235 with A bits and a PMI 1240 with D bits. In this instance, the PMI 1240 with D bits may be determined with reference to PMI payload values provided in Tables 7 to 15. The remaining parts other than the RI/CRI 1230, the CQI 1235, or the PMI 1240 in the data bit part 1410 may be filled with the padding bit 1426. Subsequently, the base station decodes the CRC 1415, and may determine whether entire polar code sequence decoding is successfully performed. In any case whether rank=1, rank=2, rank=3, or rank=4, the CQI with A bits represents the channel quality of a single codeword. Therefore, payload of the CQI is not changed based on a rank. However, it should be taken into consideration that a PMI with B bits, C bits, or D bits may be changed based on the rank.

Figure 13:
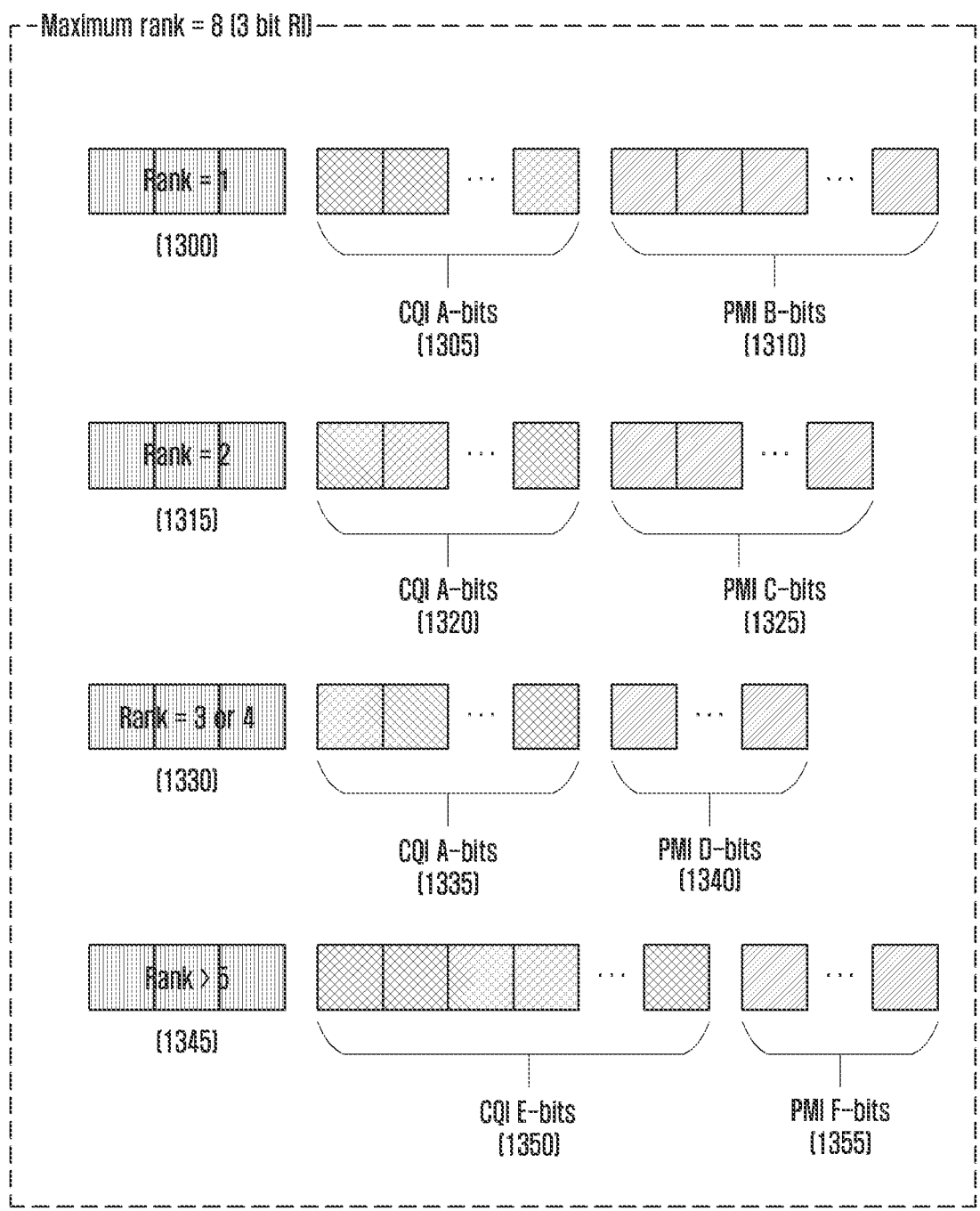
FIG. 13 is a diagram illustrating an example of CSI mapping when the maximum rank is 8 according to an embodiment of the disclosure.

FIG. 13 is a diagram illustrating an example of CSI mapping when the maximum rank is 8 according to an embodiment of the disclosure. As another example, a base station may consider the case in which the maximum rank is determined as 8 by CRI decoding (i.e., when a CSI-RS resource indicated by a CRI includes eight or more CSI-RS ports) or the case in which the maximum rank is determined as 8 by higher layer signaling.

Referring to FIG. 13, when an RI decoding result shows that an RI 1300 is 000 (rank=1), it is recognized that the data bit part 1410 includes a CQI 1305 with A bits and a PMI 1310 with B bits. In this instance, the PMI 1310 with B bits may be determined with reference to PMI payload values provided in Tables 7 to 15. The remaining parts other than the RI/CRI 1300, the CQI 1305, or the PMI 1310 in the data bit part 1410 may be filled with the padding bit 1426.

When an RI 1315 is 001 (rank=2), it is recognized that the data bit part 1410 includes a CQI 1320 with A bits and a PMI 1325 with C bits. In this instance, the PMI 1325 with C bits may be determined with reference to PMI payload values provided in Tables 7 to 15. The remaining parts other than the RI/CRI 1315, the CQI 1320, or the PMI 1325 in the data bit part 1410 may be filled with the padding bit 1426. When an RI 1330 is 010 or 011 (rank=3 or 4), it is recognized that the data bit part 1410 includes a CQI 1335 with A bits and a PMI 1340 with D bits. In this instance, the PMI 1340 with D bits may be determined with reference to PMI payload values provided in Tables 7 to 15. The remaining parts other than the RI/CRI 1330, the CQI 1335, or the PMI 1340 in the data bit part 1410 may be filled with the padding bit 1426. When an RI 1345 is 100, 101, or 110 (rank=5, 6, 7, or 8), it is recognized that the data bit part 1410 includes a CQI 1350 with E bits and a PMI 1355 with F bits. In this instance, the PMI 1355 with F bits may be determined with reference to PMI payload values provided in Tables 7 to 15. The remaining parts other than the RI/CRI 1345, the CQI 1350, or the PMI 1355 in the data bit part 1410 may be filled with the padding bit 1426. Subsequently, the base station decodes the CRC 1415, and may determine whether entire polar code sequence decoding is successfully performed.

In any case when rank is 1, 2, 3, or 4, the CQI with A bits represents the channel quality of a single codeword, and thus, payload is not changed based on a rank. However, in any case when rank is 5, 6, 7, or 8, the channel quality of two codewords may be represented, and thus, the payload may need to be increased. For example, independent CQIs are applied to two codewords, CQI payload with E=2A bits are needed. When A bits are allocated to a first CQI and a differential CQI is applied to a second CQI, E bits CQI payload that satisfies A<E<2A may be allocated. It should be taken into consideration that a PMI with B, C, D, or F bits may be changed based on the rank.

Second Embodiment: Encoding in Order of CRI-RI-Padding-CQI-PMI

Referring to FIG. 14, in the second embodiment, UCI elements, such as a CRI/RI 1430, or the like, which may affect the payload of other UCI elements, may be encoded before a padding bit 1432 is encoded. Other UCI elements related to CSI reporting, such as a PMI 1436, a CQI 1434, or the like may be appointed to be encoded after the padding bit 1432 is encoded. That is to improve reliability of some UCI elements such as the CQI, the PMI, or the like, via the padding bits, when the data bit part 1410 is decoded based on the frozen bit part 1405 in the polar code sequence 1400 including the frozen bit part 1405, the data bit part 1410, and the CRC 1415. The CRI/RI 1430 may be encoded before the CQI 1434 or the PMI 1436. In this instance, the CRI may be encoded before the RI is encoded. That is, based on the fact that when the number of CSI-RS ports included in a CSI-RS resource indicated by a CRI reported by a terminal is changed, the maximum allowed rank is changed and the payload of the RI may be changed.

A base station may estimate the payload of the CQI 1434 or the PMI 1436 after decoding the CRI/RI 1430, and subsequently, decoding is performed by taking into consideration payload other than the payload for CRI/RI 1430, CQI 1434, and PMI 1436 in the data bit part 1410 are the padding bit 1432.

Referring to FIG. 11, for example, when the maximum rank is determined as 1 by CRI decoding (when a CSI-RS resource indicated by a CRI includes a single CSI-RS port) or when the maximum rank is determined as 1 by higher layer signaling, a base station may be aware that the data bit part 1410 includes the CQI 1130 with A bits and the PMI 1135 with B bits. In this instance, the PMI 1135 with B bits may be determined with reference to PMI payload values provided in Tables 7 to 15. The remaining parts other than the CQI 1130 or the PMI 1135 in the data bit part 1410 may be filled with the padding bit 1432. Subsequently, the base station decodes the CRC 1415, and may determine whether entire polar code sequence decoding is successfully performed. In the case of rank 1, the CQI with A bits may represent the channel quality of a single codeword.

As another example, a base station may consider the case in which the maximum rank is determined as 2 by CRI decoding (i.e., when a CSI-RS resource indicated by a CRI includes two CSI-RS ports) or by higher layer signaling. As illustrated in FIG. 11, when an RI decoding result shows that the RI 1100 is 0 (rank=1), it is recognized that the data bit part 1410 includes the CQI 1105 with A bits and the PMI 1110 with B bits. In this instance, the PMI 1110 with B bits may be determined with reference to PMI payload values provided in Tables 7 to 15. The remaining parts other than the RI/CRI 1100, the CQI 1105, or the PMI 1110 in the data bit part 1410 may be filled with the padding bit 1432.

When the RI 1115 is 1 (rank=2), it is recognized that the data bit part 1410 includes the CQI 1120 with A bits and the PMI 1125 with C bits. In this instance, the PMI 1125 with C bits may be determined with reference to PMI payload values provided in Tables 7 to 15. The remaining parts other than the RI/CRI 1115, the CQI 1120, or the PMI 1125 in the data bit part 1410 may be filled with the padding bit 1432. Subsequently, the base station decodes the CRC 1415, and may determine whether entire polar code sequence decoding is successfully performed. In either case whether rank=1 or rank=2, the CQI with A bits represents the channel quality of a single codeword. Therefore, payload of the CQI is not changed based on a rank. However, it should be taken into consideration that a PMI with B bits or C bits may be changed based on the rank.

Referring to FIG. 12, as another example, a base station may consider the case in which the maximum rank is determined as 4 by CRI decoding (i.e., when a CSI-RS resource indicated by a CRI includes four CSI-RS ports) or by higher layer signaling. As illustrated in FIG. 12, when an RI decoding result shows that the RI 1200 is 00 (rank=1), it is recognized that the data bit part 1410 includes the CQI 1205 with A bits and the PMI 1210 with B bits. In this instance, the PMI 1210 with B bits may be determined with reference to PMI payload values provided in Tables 7 to 15. The remaining parts other than the RI/CRI 1200, the CQI 1205, or the PMI 1210 in the data bit part 1410 may be filled with the padding bit 1432.

When the RI 1215 is 01 (rank=2), it is recognized that the data bit part 1410 includes the CQI 1220 with A bits and the PMI 1225 with C bits. In this instance, the PMI 1225 with C bits may be determined with reference to PMI payload values provided in Tables 7 to 15. The remaining parts other than the RI/CRI 1215, the CQI 1220, or the PMI 1225 in the data bit part 1410 may be filled with the padding bit 1432. When the RI 1230 is 10 or 11 (rank=3 or 4), it is recognized that the data bit part 1410 includes the CQI 1235 with A bits and the PMI 1240 with D bits. In this instance, the PMI 1240 with D bits may be determined with reference to PMI payload values provided in Tables 7 to 15. The remaining parts other than the RI/CRI 1230, the CQI 1235, or the PMI 1240 in the data bit part 1410 may be filled with the padding bit 1432. Subsequently, the base station decodes the CRC 1415, and may determine whether entire polar code sequence decoding is successfully performed. In any case whether rank=1, rank=2, rank=3, or rank=4, the CQI with A bits represents the channel quality of a single codeword. Therefore, payload of the CQI is not changed based on a rank. However, it should be taken into consideration that a PMI with B bits, C bits, or D bits may be changed based on the rank.

Referring to FIG. 13, as another example, a base station may consider the case in which the maximum rank is determined as 8 by CRI decoding (i.e., when a CSI-RS resource indicated by a CRI includes eight or more CSI-RS ports) or by higher layer signaling. As illustrated in FIG. 13, when an RI decoding result shows that the RI 1300 is 000 (rank=1), it is recognized that the data bit part 1410 includes the CQI 1305 with A bits and the PMI 1310 with B bits. In this instance, the PMI 1310 with B bits may be determined with reference to PMI payload values provided in Tables 7 to 15. The remaining parts other than the RI/CRI 1300, the CQI 1305, or the PMI 1310 in the data bit part 1410 may be filled with the padding bit 1432.

When the RI 1315 is 001 (rank=2), it is recognized that the data bit part 1410 includes the CQI 1320 with A bits and the PMI 1325 with C bits. In this instance, the PMI 1325 with C bits may be determined with reference to PMI payload values provided in Tables 7 to 15. The remaining parts other than the RI/CRI 1315, the CQI 1320, or the PMI 1325 in the data bit part 1410 may be filled with the padding bit 1432. When the RI 1330 is 010 or 011 (rank=3 or 4), it is recognized that the data bit part 1410 includes the CQI 1335 with A bits and the PMI 1340 with D bits. In this instance, the PMI 1340 with D bits may be determined with reference to PMI payload values provided in Tables 7 to 15. The remaining parts other than the RI/CRI 1330, the CQI 1335, or the PMI 1340 in the data bit part 1410 may be filled with the padding bit 1432. When the RI 1345 is 100, 101, or 110 (rank=5, 6, 7, or 8), it is recognized that the data bit part 1410 includes the CQI 1350 with E bits and the PMI 1355 with F bits. In this instance, the PMI 1355 with F bits may be determined with reference to PMI payload values provided in Tables 7 to 15. The remaining parts other than the RI/CRI 1345, the CQI 1350, or the PMI 1355 in the data bit part 1410 may be filled with the padding bit 1432. Subsequently, the base station decodes the CRC 1415, and may determine whether entire polar code sequence decoding is successfully performed.

In any case when rank is 1, 2, 3, or 4, the CQI with A bits represents the channel quality of a single codeword, and thus, payload is not changed based on a rank. However, in any case when rank is 5, 6, 7, or 8, the channel quality of two codewords may be represented, and thus, the payload may need to be increased. For example, independent CQIs are applied to two codewords, CQI payload with E=2A bits are needed. When A bits are allocated to a first CQI and a differential CQI is applied to a second CQI, E bits CQI payload that satisfies A<E<2A may be allocated. It should be taken into consideration that a PMI with B, C, D, or F bits may be changed based on the rank.

Third Embodiment: Encoding in Order of CRI-RI-Padding-CQI-Padding-PMI

Referring to FIG. 14, in the third embodiment, UCI elements, such as a CRI/RI 1440, or the like, which may affect the payload of other UCI elements may be encoded before a padding 1 bit 1442 or a padding 2 bit 1446 is encoded. Other UCI elements related to CSI reporting, such as a CQI 1444, a PMI 1448, or the like may be appointed to be encoded after the padding 1 bit 1442 or the padding 2 bit 1446 is encoded. That is to improve reliability of some UCI elements such as the CQI, the PMI, or the like, via the padding bits, when the data bit part 1410 is decoded based on the frozen bit part 1405 in the polar code sequence 1400 including the frozen bit part 1405, the data bit part 1410, and the CRC 1415.

The CRI/RI 1440 may be encoded before the CQI 1444 or the PMI 1448. In this instance, the CRI may be encoded before the RI is encoded. That is based on the fact that when number of CSI-RS ports included in a CSI-RS resource indicated by a CRI reported by a terminal is changed, the maximum allowed rank is changed, and the payload of the RI may be changed. In this instance, the padding bit may be divided into two or more padding bit groups (padding 1 bit 1442 and padding 2 bit 1446), and each padding bit group may be encoded before the CQI 1444 is encoded (padding 1 bit 1442), or may be encoded before the PMI 1448 (padding 2 bit 1446). That is based on the fact that conditions for change of the payload of the CQI 1444 and the PMI 1448 are different from each other. That may reduce the effect of payload estimation error associated with the CQI 1444 or the PMI 1448 caused by a CRI/RI decoding error or the like. For example, the payload of a CQI changes less sensitively than PMI payload, and thus, a change of the padding bit payload may decrease and an error propagation probability may be reduced.

A base station may estimate the payload of the CQI 1444 or the PMI 1448 after decoding the CRI/RI 1440, and subsequently, decoding is performed by taking into consideration that payload other than the payload for CRI/RI 1440, CQI 1444, and PMI 1438 in the data bit part 1410 are padding bits 1442 and 1446. In this instance, two or more padding bit groups may be appointed such that they have the same payload (Padding1==Padding2) or they are determined based on a predetermined condition (e.g., padding 1 is not used when the maximum rank<=4). That is based on the fact that the payload of a CQI does not change based on a rank when the maximum rank is less than or equal to 4. In this instance, it is understood that a padding bit is encoded and exists between {CRI, RI, CQI} and {PMI}.

Referring to FIG. 11, for example, when the maximum rank is determined as 1 by CRI decoding (when a CSI-RS resource indicated by a CRI includes a single CSI-RS port) or when the maximum rank is determined as 1 by higher layer signaling, a base station may be aware that the data bit part 1410 includes the CQI 1130 with A bits and the PMI 1135 with B bits. In this instance, the PMI 1135 with B bits may be determined with reference to PMI payload values provided in Tables 7 to 15. The remaining parts other than the CQI 1130 or the PMI 1135 in the data bit part 1410 may be filled with the padding bits 1442 and 1446. Subsequently, the base station decodes the CRC 1415, and may determine whether entire polar code sequence decoding is successfully performed. In the case of rank 1, the CQI with A bits may represent the channel quality of a single codeword.

As another example, a base station may consider the case in which the maximum rank is determined as 2 by CRI decoding (i.e., when a CSI-RS resource indicated by a CRI includes two CSI-RS ports) or by higher layer signaling. As illustrated in FIG. 11, when an RI decoding result shows that the RI 1100 is 0 (rank=1), it is recognized that the data bit part 1410 includes the CQI 1105 with A bits and the PMI 1110 with B bits. In this instance, the PMI 1110 with B bits may be determined with reference to PMI payload values provided in Tables 7 to 15. The remaining parts other than the RI/CRI 1100, the CQI 1105, or the PMI 1110 in the data bit part 1410 may be filled with the padding bits 1442 and 1446.

When the RI 1115 is 1 (rank=2), it is recognized that the data bit part 1410 includes the CQI 1120 with A bits and the PMI 1125 with C bits. In this instance, the PMI 1125 with C bits may be determined with reference to PMI payload values provided in Tables 7 to 15. The remaining parts other than the RI/CRI 1115, the CQI 1120, or the PMI 1125 in the data bit part 1410 may be filled with the padding bits 1442 and 1446. Subsequently, the base station decodes the CRC 1415, and may determine whether entire polar code sequence decoding is successfully performed. In either case whether rank=1 or rank=2, the CQI with A bits represents the channel quality of a single codeword. Therefore, payload of the CQI is not changed based on a rank. However, it should be taken into consideration that a PMI with B bits or C bits may be changed based on the rank.

Referring to FIG. 12, as another example, a base station may consider the case in which the maximum rank is determined as 4 by CRI decoding (i.e., when a CSI-RS resource indicated by a CRI includes four CSI-RS ports) or the case in which the maximum rank is determined as 4 by higher layer signaling. As illustrated in FIG. 12, when an RI decoding result shows that the RI 1200 is 00 (rank=1), it is recognized that the data bit part 1410 includes the CQI 1205 with A bits and the PMI 1210 with B bits. In this instance, the PMI 1210 with B bits may be determined with reference to PMI payload values provided in Tables 7 to 15. The remaining parts other than the RI/CRI 1200, the CQI 1205, or the PMI 1210 in the data bit part 1410 may be filled with the padding bits 1442 and 1446. When the RI 1215 is 01 (rank=2), it is recognized that the data bit part 1410 includes the CQI 1220 with A bits and the PMI 1225 with C bits. In this instance, the PMI 1225 with C bits may be determined with reference to PMI payload values provided in Tables 7 to 15. The remaining parts other than the RI/CRI 1215, the CQI 1220, or the PMI 1225 in the data bit part 1410 may be filled with the padding bits 1442 and 1446.

When the RI 1230 is 10 or 11 (rank=3 or 4), it is recognized that the data bit part 1410 includes the CQI 1235 with A bits and the PMI 1240 with D bits. In this instance, the PMI 1240 with D bits may be determined with reference to PMI payload values provided in Tables 7 to 15. The remaining parts other than the RI/CRI 1230, the CQI 1235, or the PMI 1240 in the data bit part 1410 may be filled with the padding bits 1442 and 1446. Subsequently, the base station decodes the CRC 1415, and may determine whether entire polar code sequence decoding is successfully performed. In any case whether rank=1, rank=2, rank=3, or rank=4, the CQI with A bits represents the channel quality of a single codeword. Therefore, payload of the CQI is not changed based on a rank. However, it should be taken into consideration that a PMI with B bits, C bits, or D bits may be changed based on the rank.

Referring to FIG. 13, as another example, a base station may consider the case in which the maximum rank is determined as 8 by CRI decoding (i.e., when a CSI-RS resource indicated by a CRI includes eight or more CSI-RS ports) or by higher layer signaling. As illustrated in FIG. 13, when an RI decoding result shows that the RI 1300 is 000 (rank=1), it is recognized that the data bit part 1410 includes the CQI 1305 with A bits and the PMI 1310 with B bits. In this instance, the PMI 1310 with B bits may be determined with reference to PMI payload values provided in Tables 7 to 15. The remaining parts other than the RI/CRI 1300, the CQI 1305, or the PMI 1310 in the data bit part 1410 may be filled with the padding bits 1442 and 1446. When the RI 1315 is 001 (rank=2), it is recognized that the data bit part 1410 includes the CQI 1320 with A bits and the PMI 1325 with C bits. In this instance, the PMI 1325 with C bits may be determined with reference to PMI payload values provided in Tables 7 to 15. The remaining parts other than the RI/CRI 1315, the CQI 1320, or the PMI 1325 in the data bit part 1410 may be filled with the padding bits 1442 and 1446. When the RI 1330 is 010 or 011 (rank=3 or 4), it is recognized that the data bit part 1410 includes the CQI 1335 with A bits and the PMI 1340 with D bits. In this instance, the PMI 1340 with D bits may be determined with reference to PMI payload values provided in Tables 7 to 15. The remaining parts other than the RI/CRI 1330, the CQI 1335, or the PMI 1340 in the data bit part 1410 may be filled with the padding bits 1442 and 1446. When the RI 1345 is 100, 101, or 110 (rank=5, 6, 7, or 8), it is recognized that the data bit part 1410 includes the CQI 1350 with E bits and the PMI 1355 with F bits. In this instance, the PMI 1355 with F bits may be determined with reference to PMI payload values provided in Tables 7 to 15. The remaining parts other than the RI/CRI 1345, the CQI 1350, or the PMI 1355 in the data bit part 1410 may be filled with the padding bits 1442 and 1446. Subsequently, the base station decodes the CRC 1415, and may determine whether entire polar code sequence decoding is successfully performed.

In any case when rank is 1, 2, 3, or 4, the CQI with A bits represents the channel quality of a single codeword, and thus, payload is not changed based on a rank. However, in any case when rank is 5, 6, 7, or 8, the channel quality of two codewords may be represented, and thus, the payload may need to be increased. For example, independent CQIs are applied to two codewords, CQI payload with E=2A bits are needed. When A bits are allocated to a first CQI and a differential CQI is applied to a second CQI, E bits CQI payload that satisfies A<E<2A may be allocated. It should be taken into consideration that a PMI with B, C, D, or F bits may be changed based on the rank.

The polar code sequence mapping methods according to the above-described embodiments assume that the payload of UCI elements is greater than or equal to 12 bits (K>11). When the total UCI payload that a terminal needs to transmit for each time is less than or equal to 11 (K<=11), the terminal may need to map UCI based on a Reed-Muller code, as opposed to the above embodiments. Here, K may be determined based on the total sum of actually meaningful UCI elements (i.e., the total sum of the payload of at least one of a CRI, an RI, a CQI, and a PMI). However, K may be determined based on the total sum of meaningful UCI elements and padding bits (i.e., payload of at least one of a CRI, an RI, a CQI, and a PMI+padding bit payload), which may be the maximum transmittable payload. Also, the values may be determined in consideration of HARQ ACK/NACK information.

The relative positions of the CRI/RI or CQI and PMI may be variable when they are actually applied. The relative positions of the CRI/RI/CQI/PMI and padding bits need to be importantly taken into consideration.

In the embodiments, a padding bit is used for ease of description. The padding bit may be expressed as various terms, such as an additional frozen bit, a remaining UCI bit index, or the like for actual use.

In the embodiments, at least one of UCI elements (CRI, RI, CQI, and PMI) may be interchangeably replaced with a CRI and/or a CSI-RSRP or a synchronization signal block index (SSBI) and/or an SSB-RSRP. In this instance, the CRI and the SSBI may be a list of indices including one or more CRIs or SSBIs, and also the CSI-RSRP and the SSB-RSRP may indicate RSRPs associated with CSI-RSs or SSBs indicated by corresponding index lists. Description of detailed examples thereof will be omitted since a PUCCH UCI encoding method according to the payload of a CRI and a CSI-RSRP or the payload of an SSBI and an SSB-RSRP is similar to the first, second, and third embodiments.

Figure 15:
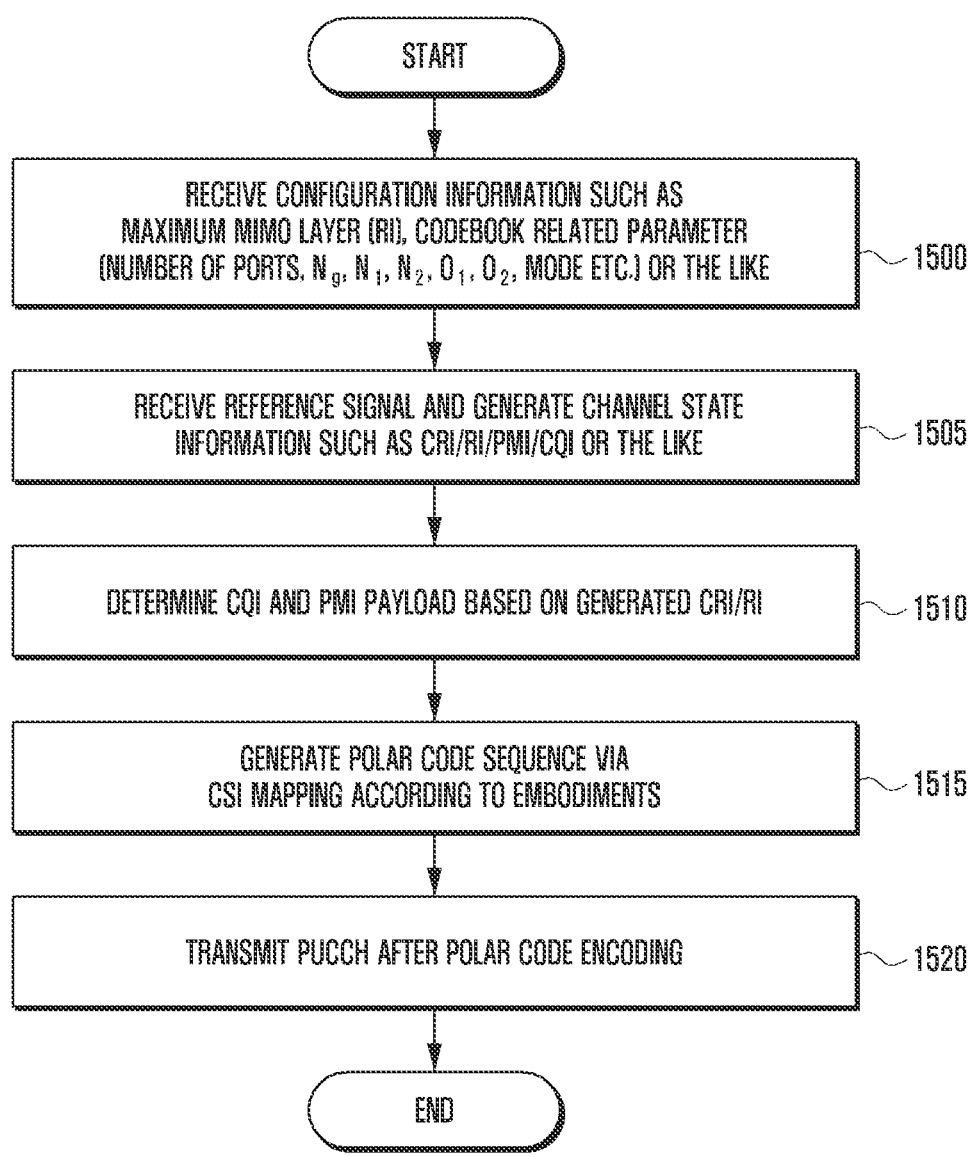
FIG. 15 is a flowchart illustrating an operation of CSI reporting via a PUCCH according to an embodiment of the disclosure.

FIG. 15 is a flowchart illustrating the operation of generating a polar code sequence and transmitting a PUCCH according to an embodiment of the disclosure.

Referring to FIG. 15, a terminal receives the maximum MIMO layer (maximum RI), a codebook related parameter (number of ports, $N_g$, $N_1$, $N_2$, $O_1$, $O_2$, mode, codebook type, and the like), and reference signal configuration information from a base station, in operation 1500. Subsequently, the base station receives a reference signal according to the configuration information, and generates channel state information such as a CRI, an RI, a PMI, a CQI, and the like, in operation 1505. The terminal determines payload for reporting the RI, PMI, or CQI, based on the CQI or RI determined when the channel state information are determined, in operation 1510. Subsequently, the terminal generates a polar code sequence according to one of the CSI mapping methods according to the embodiments, in operation 1515. The polar code sequence is transmitted to the base station via a PUCCH after polar code encoding, in operation 1520.

Figure 16:
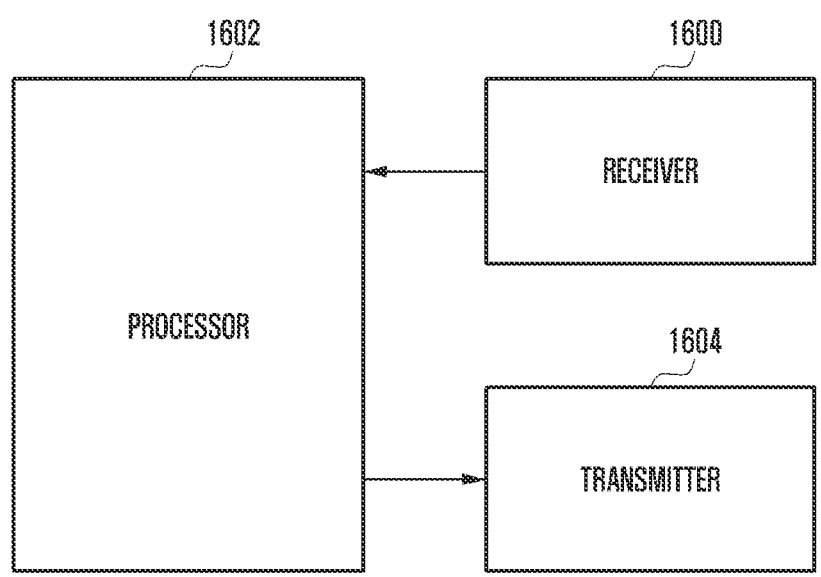
FIG. 16 is a diagram illustrating a structure of a terminal according to an embodiment of the disclosure.
Figure 17:
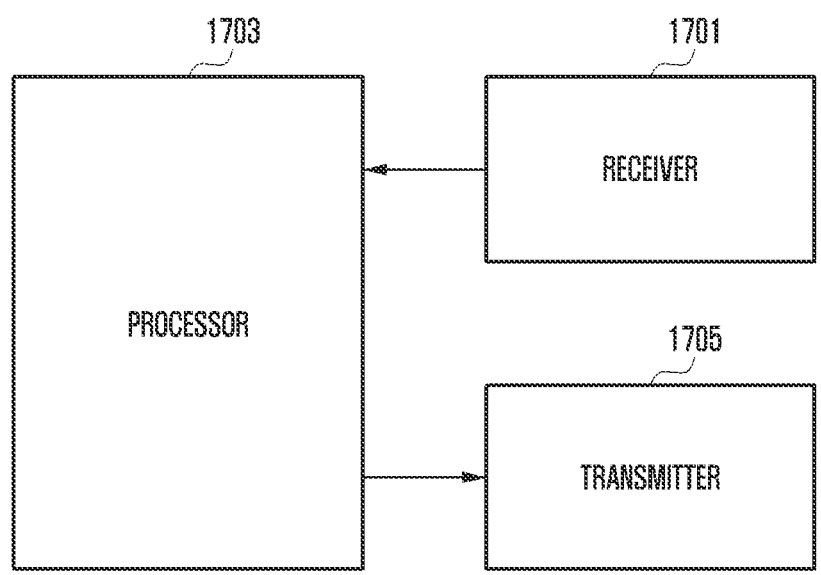
FIG. 17 is a diagram illustrating a structure of a base station according to an embodiment of the disclosure.

To perform the above-described embodiments of the disclosure, a transmitter, a receiver, and a processor of each of the terminal and the base station are illustrated in FIGS. 16 and 17. To perform a CSI mapping method according to the embodiments, a receiver, a processor, and a transmitter of each of the base station and the terminal operate according to a corresponding embodiment.

FIG. 16 is a block diagram of the configuration of a terminal according to an embodiment of the disclosure.

Referring to FIG. 16, the terminal of the disclosure may include a terminal receiver 1600, a terminal transmitter 1604, and a terminal processor 1602. The terminal receiver 1600 and the terminal transmitter 1604 are commonly called a transceiver in the embodiments of the disclosure. The transceiver may transmit and receive a signal to/from a base station. The signal may include control information and data. To this end, the transceiver includes an RF transmitter that up-converts and amplifies the frequency of a transmitted signal, an RF receiver that low-noise amplifies a received signal and down-converts the frequency, and the like. Also, the transceiver outputs, to the terminal processor 1602, a signal received via a radio channel, and transmits a signal output from the terminal processor 1602 via a radio channel.

The terminal processor 1602 may control a series of processes such that the terminal operates according to the above-described embodiments of the disclosure. For example, the terminal receiver 1600 receives configuration information for each CSI reporting from the base station, and the terminal processor 1602 may perform control so as to interpret a CSI mapping method according to the configuration. Subsequently, the terminal transmitter 1604 may transmit a PUCCH generated according to the CSI mapping method.

FIG. 17 is a block diagram of the configuration of a base station according to an embodiment of the disclosure.

Referring to FIG. 17, the base station of the disclosure may include a base station receiver 1701, a base station transmitter 1705, and a base station processor 1703. The base station receiver 1701 and the base station transmitter 1705 are commonly called a transceiver in the embodiments of the disclosure. The transceiver may transmit and receive a signal to/from a terminal. The signal may include control information and data. To this end, the transceiver includes an RF transmitter that up-converts and amplifies a frequency of a transmitted signal, an RF receiver that low-noise amplifies a received signal and down-converts the frequency, and the like. Also, the transceiver outputs, to the base station processor 1703, a signal received via a radio channel, and transmits a signal output from the base station processor 1703 via a radio channel. The base station processor 1703 may control a series of processes such that the base station operates according to the above-described embodiments of the disclosure.

For example, the base station processor 1703 may determine a PUCCH decoding method based on configuration information related to CSI generation which has been known to the terminal. Subsequently, the base station receiver 1701 decodes a PUCCH received according to the embodiments.

Meanwhile, the embodiments of the disclosure disclosed in the present specification and the drawings have been presented to easily explain technical contents of the disclosure and help comprehension of the disclosure, and do not limit the scope of the disclosure. That is, it is obvious to those skilled in the art to which the disclosure belongs that different modifications can be achieved based on the technical spirit of the disclosure. Also, each embodiment may be used in combinations. For example, a base station and a terminal may operate based on the combination of a part of the first embodiment and a part of the second embodiment of the disclosure. Also, other modifications based on the technical ideas of the embodiments may be applied to various systems, such as an FDD LTE system, a TDD LTE system, a 5G or NR system, and the like.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A method performed by a terminal in a wireless communication system, the method comprising:
receiving, from a base station, channel state information (CSI) feedback configuration information;
obtaining CSI including a rank indicator (RI), and at least one of a precoding matrix indicator (PMI) or a channel quality indicator (CQI), based on the CSI feedback configuration information;
identifying an information sequence including the CSI, wherein the RI are placed before padding bits in the information sequence, and the at least one of the PMI or the CQI are placed after the padding bits in the information sequence;
identifying a polar code sequence based on the information sequence;
encoding the polar code sequence; and
transmitting, to the base station, the encoded polar code sequence,
wherein the polar code sequence includes plural frozen bits and plural data bits corresponding to the information sequence.

2. The method of claim 1, wherein a number of the padding bits is identified based on a payload of the at least one of the PMI or the CQI corresponding to a rank indicated by the RI.

3. The method of claim 1,
wherein the polar code sequence includes cyclic redundancy check (CRC) bits.

4. The method of claim 1, wherein the CSI further includes a CSI resource indicator (CRI), the CRI is placed before the RI in the information sequence.

5. A method performed by a base station in a wireless communication system, the method comprising:
transmitting, to a terminal, channel state information (CSI) feedback configuration information;
receiving, from the terminal, an encoded polar code sequence corresponding to the CSI feedback configuration information; and
decoding the encoded polar code sequence to obtain a polar code sequence including an information sequence,
wherein the polar code sequence includes plural frozen bits and plural data bits corresponding to the information sequence,
wherein the information sequence includes CSI and padding bits, and
wherein the CSI includes a rank indicator (RI) placed before the padding bits, and at least one of a precoding matrix indicator (PMI) or a channel quality indicator (CQI) placed after the padding bits.

6. The method of claim 5, wherein a number of the padding bits is based on a payload of the at least one of the PMI or the CQI corresponding to a rank indicated by the RI.

7. The method of claim 5,
wherein the polar code sequence includes cyclic redundancy check (CRC) bits.

8. The method of claim 5, wherein the CSI further includes a CSI resource indicator (CRI), the CRI is placed before the RI in the information sequence.

9. A terminal in a wireless communication system, the terminal comprising:
a transceiver; and
a controller coupled with the transceiver and configured to:
receive, from a base station, channel state information (CSI) feedback configuration information,
obtain CSI including a rank indicator (RI), and at least one of a precoding matrix indicator (PMI) or a channel quality indicator (CQI), based on the CSI feedback configuration information,
identify an information sequence including the CSI, wherein the RI are placed before padding bits in the information sequence, and the at least one of the PMI or the CQI are placed after the padding bits in the information sequence,
identify a polar code sequence based on the information sequence, perform an encoding of the polar code sequence, and transmit, to the base station, the encoded polar code sequence, wherein the polar code sequence includes plural frozen bits and plural data bits corresponding to the information sequence.

10. The terminal of claim 9, wherein a number of the padding bits is identified based on a payload of the at least one of the PMI or the CQI corresponding to a rank indicated by the RI.

11. The terminal of claim 9,
wherein the polar code sequence includes cyclic redundancy check (CRC) bits.

12. The terminal of claim 9, wherein the CSI further includes a CSI resource indicator (CRI), the CRI is placed before the RI in the information sequence.

13. A base station in a wireless communication system, the base station comprising:
a transceiver; and
a controller coupled with the transceiver and configured to:
transmit, to a terminal, channel state information (CSI) feedback configuration information,
receive, from the terminal, an encoded polar code sequence corresponding to the CSI feedback configuration information, and
perform a decoding based on the encoded polar code sequence to obtain a polar code sequence including an information sequence,
wherein the polar code sequence includes plural frozen bits and plural data bits corresponding to the information sequence,
wherein the information sequence includes CSI and padding bits, and
wherein the CSI includes a rank indicator (RI) placed before the padding bits, and at least one of a precoding matrix indicator (PMI) or a channel quality indicator (CQI) placed after the padding bits.

14. The base station of claim 13, wherein a number of the padding bits is based on a payload of the at least one of the PMI or the CQI corresponding to a rank indicated by the RI.

15. The base station of claim 13,
wherein the polar code sequence includes cyclic redundancy check (CRC) bits.

16. The base station of claim 13, wherein the CSI further includes a CSI resource indicator (CRI), the CRI is placed before the RI in the information sequence.

17. The method of claim 1, wherein a reliability corresponding to a bit of first bit index in the polar code sequence is different from a reliability corresponding to a bit of second bit index in the polar code sequence.

18. The method of claim 1, wherein the plural frozen bits are set as a predetermined value in the polar code sequence.

19. The method of claim 5, wherein a reliability corresponding to a bit of first bit index in the polar code sequence is different from a reliability corresponding to a bit of second bit index in the polar code sequence.

20. The method of claim 5, wherein the plural frozen bits are set as a predetermined value in the polar code sequence.

21. The terminal of claim 9, wherein a reliability corresponding to a bit of first bit index in the polar code sequence is different from a reliability corresponding to a bit of second bit index in the polar code sequence.

22. The terminal of claim 9, wherein the plural frozen bits are set as a predetermined value in the polar code sequence.

23. The base station of claim 13, wherein a reliability corresponding to a bit of first bit index in the polar code sequence is different from a reliability corresponding to a bit of second bit index in the polar code sequence.

24. The base station of claim 13, wherein the plural frozen bits are set as a predetermined value in the polar code sequence.

* * * * *